(12) United States Patent
Graham et al.

(10) Patent No.: US 9,318,872 B2
(45) Date of Patent: Apr. 19, 2016

(54) VCSEL WITH INTEGRATED ELECTRICALLY MODULATED INTRA-CAVITY GRAPHENE ABSORBER

(71) Applicant: Finisar Corporation, Sunnyvale, CA (US)

(72) Inventors: Luke A. Graham, Allen, TX (US); Ralph H. Johnson, Murphy, TX (US); James K. Guenter, Garland, TX (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/589,392

(22) Filed: Jan. 5, 2015

(65) Prior Publication Data

US 2015/0194789 A1    Jul. 9, 2015

Related U.S. Application Data

(60) Provisional application No. 61/923,428, filed on Jan. 3, 2014.

(51) Int. Cl.
| | |
|---|---|
| *H01S 3/00* | (2006.01) |
| *H01S 5/183* | (2006.01) |
| *H01S 5/06* | (2006.01) |
| *H01S 3/139* | (2006.01) |
| *H01S 3/106* | (2006.01) |

(Continued)

(52) U.S. Cl.
CPC ............ *H01S 5/183* (2013.01); *H01S 3/1061* (2013.01); *H01S 3/1303* (2013.01); *H01S 3/1392* (2013.01); *H01S 5/0601* (2013.01); *H01S 5/0609* (2013.01); *H01S 5/2022* (2013.01); *Y10T 29/41* (2015.01)

(58) Field of Classification Search
CPC .............................. H01S 5/0425; H01S 5/1075
USPC ........................................................ 372/38.05
See application file for complete search history.

(56) References Cited

U.S. PATENT DOCUMENTS

| | | | | |
|---|---|---|---|---|
| 6,026,108 A | * | 2/2000 | Lim et al. ................... | 372/50.11 |
| 7,983,572 B2 | * | 7/2011 | Deng ................... | H01S 5/18302 |
| | | | | 398/182 |
| 2006/0227823 A1 | * | 10/2006 | Mohammed et al. .......... | 372/26 |

(Continued)

OTHER PUBLICATIONS

César Javier Lockhart de la Rosa, "Graphene as Transparent Conductive Film for GaN-Based Vertical Cavity Surface Emitting Lasers", thesis for the degree of Master of Nanoscience and Nanotechnology Major Nano-Electronics Goteborg, Sweden, Jun. 2012.*

(Continued)

*Primary Examiner* — Tod T Van Roy
*Assistant Examiner* — Vu A Vu
(74) *Attorney, Agent, or Firm* — Maschoff Brennan

(57) ABSTRACT

A VCSEL can include a graphene intra-cavity absorber having at least one graphene region and at least one dielectric region adjacent to the graphene region. The VCSEL can also include a graphene electrode electronically coupled with at least one graphene region. The VCSEL can also include a contact region adjacent with at least one dielectric region. The VCSEL can also include a contact electrode electronically coupled with the contact region. The VCSEL can also include a base electrode electronically coupled with a base of a semiconductor region of the VCSEL. The graphene intra-cavity absorber can include at least two graphene regions sandwiching at least one dielectric region therebetween.

20 Claims, 15 Drawing Sheets

(51) Int. Cl.
    *H01S 5/20*          (2006.01)
    *H01S 3/13*          (2006.01)

(56) References Cited

U.S. PATENT DOCUMENTS

2011/0315949 A1* 12/2011 Voutilainen et al. ............... 257/9
2013/0121353 A1* 5/2013 Kub ......................... H01S 3/10
                                                                                                                                      372/11
2013/0193404 A1* 8/2013 Koppens et al. .................. 257/9

OTHER PUBLICATIONS

Ming Liu, Xiaobo Yin, and Xiang Zhang; Double-Layer Graphene Optical Modulator; Nano Letters; NSF Nano-scale Science and Engineering Center (NSEC), 3112 Etcheverry Hall, University of California at Berkeley, Berkeley, California 94720, United States Material Sciences Division, Lawrence Berkeley National Laboratory, Berkeley, California 94720, United States; Received: Nov. 29, 2011 and Revised: Jan. 12, 2012; pp. A-D; ACS Publications; pubs.acs.org/NanoLett.

Cesar Javier Lockhart De La Rosa; Graphene as Transparent Conductive Film for GaN-Based Vertical Cavity Surface Emitting Lasers; Erasmus Mundus Master of Nanoscience and Nanotechnology; Photonics Laboratory & Quantum Device Physics Laboratory, Department of Microtechology and Nanoscience—MC2; Chalmers University of Technology; Gothenburg, Sweden, Jun. 2012, pp. 1-88.

C.-C. Lee, S. Suzuki, W. Xie, and T.R. Schibli; Broadband graphene electro-optic modulators with sub-wavelength thickness; Dep. of Physics, University of Colorado at Boulder, 2000 Colorado Avenue, Boulder, Colorado 80309-0390, USA, Grad. School of Engineering, Toyota Technological Institute, 2-12-1 Hisakata, Tempaku, Nagoya 468-8511, Japan; Dep. of Electrical, Computer and Energy Engineering, University of Colorado, Boulder, Colorado 80309-0425 USA; JILA, National Institute of Standards and Technology and University of Colorado, Boulder, Colorado 80309-0440, Optics Express, vol. 20, No. 5, Feb. 2012.

* cited by examiner

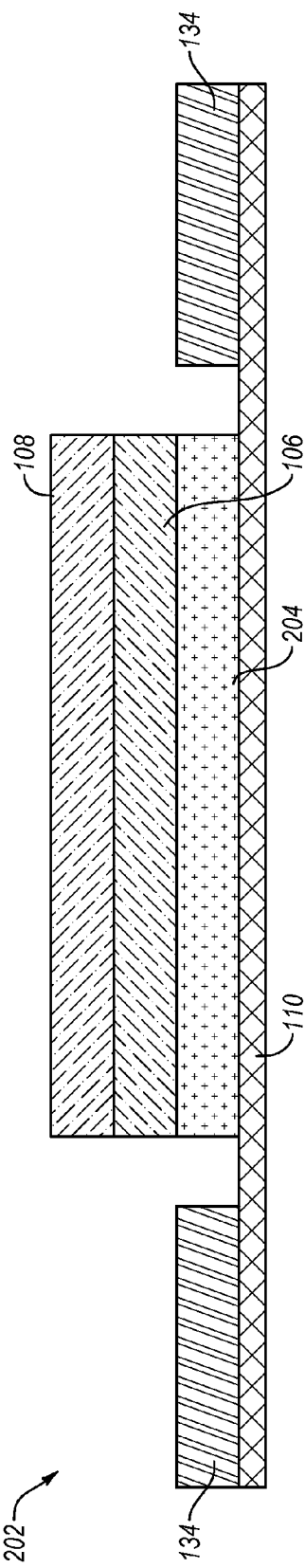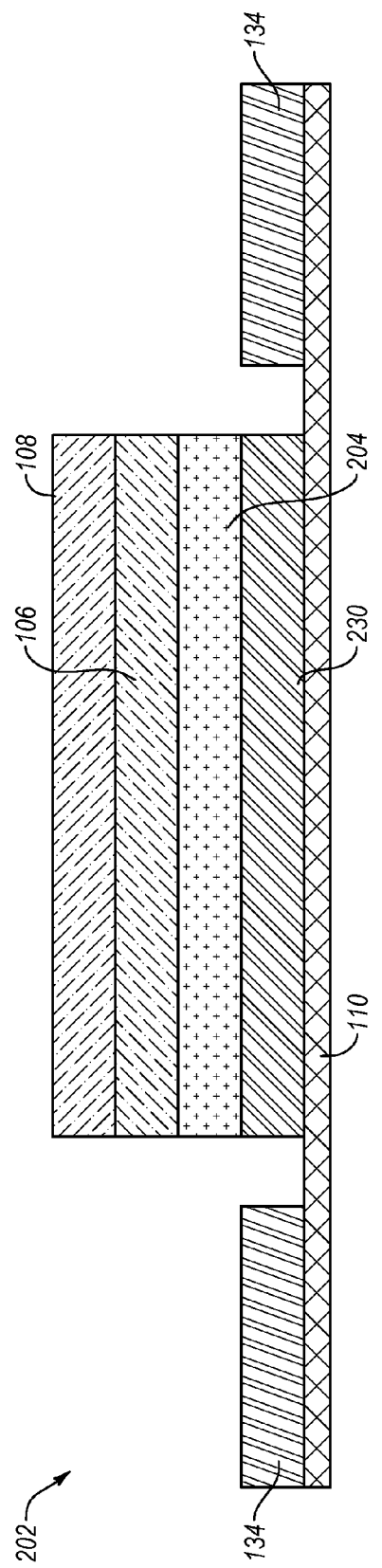

VCSEL WITH INTEGRATED ELECTRICALLY MODULATED INTRA-CAVITY GRAPHENE ABSORBER

CROSS-REFERENCE

This patent application claims priority to U.S. Provisional Application 61/923,428 filed Jan. 3, 2014, which provisional application is incorporated herein by specific reference in its entirety.

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers out put a high optical output representing binary highs and a lower power optical output representing binary lows. To obtain quick reaction time, the laser is constantly on, but varies from a high optical output to a lower optical output.

Optical networks have various advantages over other types of networks such as copper wire-based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. Copper networks consume much greater amounts of electrical power and have much larger size and weight relative to optical systems of comparable capability. That is, optical networks are able to reliably transmit data at higher rates over further distances than is possible with copper wire networks.

One type of laser that is used in optical data transmission is a Vertical Cavity Surface-Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction regions. As light passes from a region of one index of refraction to another, a portion of the light is reflected. By using a sufficient number of alternating regions, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g., a p-type mirror and an n-type mirror). Notably, the notion of top and bottom mirrors can be somewhat arbitrary. In some configurations, light could be extracted from the wafer side of the VCSEL, with the "top" mirror nearly totally reflective—and thus opaque. However, for purposes of this technology, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain.

Optical gain occurs when photons in the active region stimulate electrons in the conduction band to recombine with holes in the valence band which produces additional photons. When the optical gain exceeds the total loss in the two mirrors, laser oscillation occurs.

The active region may also include an oxide aperture formed using one or more oxide regions formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of regions that alternate between a high index of refraction and a lower index of refraction. Generally, the top mirror has fewer mirror periods of alternating high index and low index of refraction regions, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to "lase" as the optically coherent photons are emitted from the top of the VCSEL.

The subject matter claimed herein is not limited to embodiments that solve any disadvantages or that operate only in environments such as those described above. Rather, this background is only provided to illustrate one example technology where some embodiments described herein may be practiced.

Generally, improved lasers for data communication technologies are continually sought and developed. The ability to directly modulate the light emission of a laser within the laser cavity can provide many advantages. As such, it can be beneficial to create a vertical cavity surface emitting laser (VCSEL) with integrated light emission modulation.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 2A illustrates an embodiment of a graphene intra-cavity absorber in direct contact with a contact region that can be used in a VCSEL.

FIG. 2B illustrates an embodiment of a graphene intra-cavity absorber with an electrically insulating region between the graphene intra-cavity absorber and contact region that can be used in the VCSEL of FIG. 2.

DETAILED DESCRIPTION

Figure 1A:
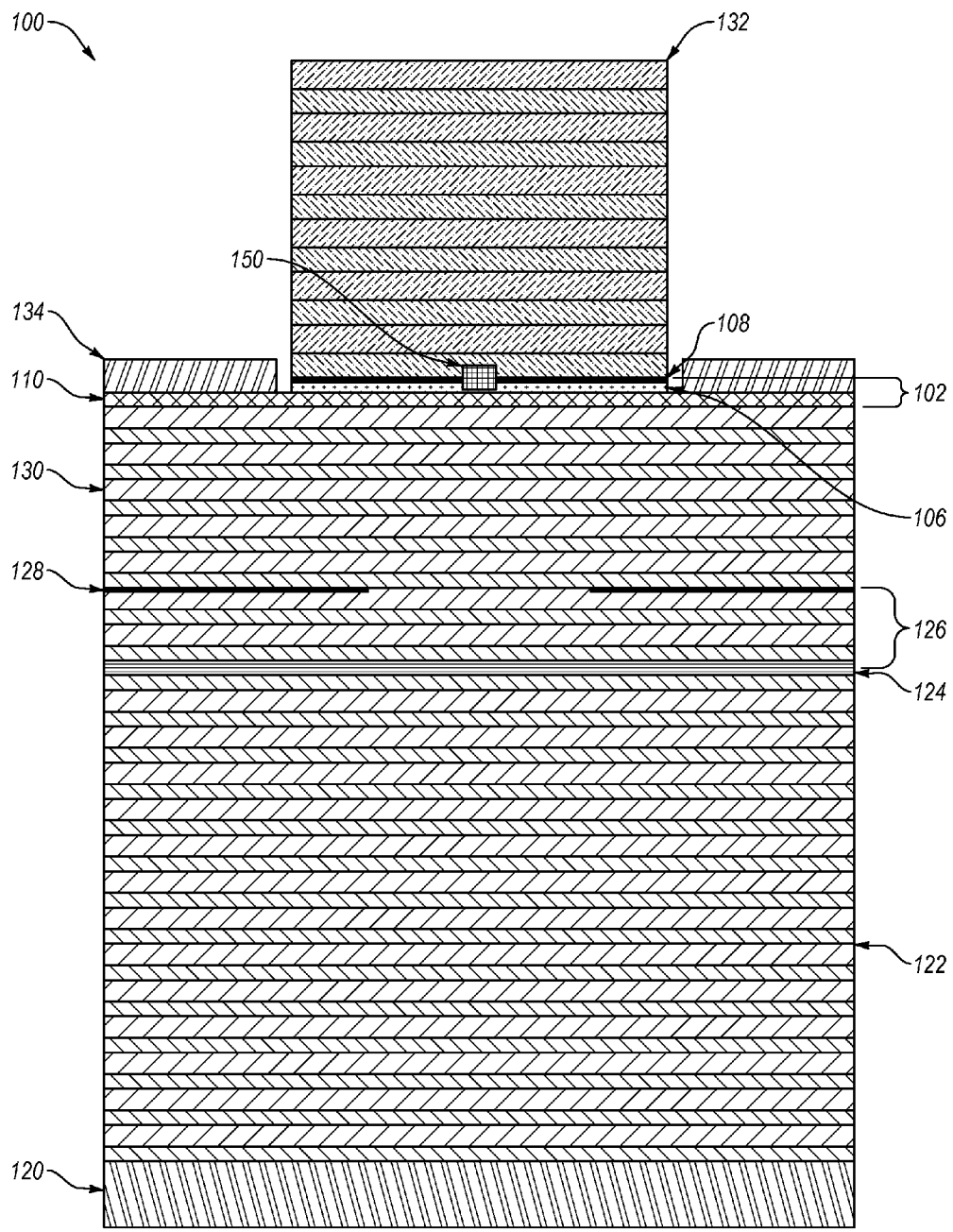
FIG. 1A illustrates a cross-sectional profile of an embodiment of a VCSEL having a graphene intra-cavity absorber that includes a single graphene region and contact region sandwiching a dielectric region.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present technology is related to a VCSEL that has a graphene intra-cavity absorber, which can be at an intra-cavity location so as to be referenced as a graphene intra-cavity absorber. The graphene intra-cavity absorber may also be configured as an integrated coupled cavity. The graphene intra-cavity absorber can function as a modulator. The graphene intra-cavity absorber can be inside the cavity in order to increase modulation effectiveness. If the graphene region it outside the cavity, the modulation depth achieved may be lower compared to an intra-cavity location; however, this may be reasonable in some instances. The graphene intra-cavity absorber can be selectively biased and unbiased in order to change the absorption properties and amount of absorption in order to modulate the light emitted from the VCSEL.

In one embodiment, the graphene intra-cavity absorber can have a structure with one or more graphene sections associated with a dielectric material. The graphene sections can be discrete graphene regions with one or more graphene layers stacked together. In one example, two separate graphene sections are included with the dielectric material between them. In another example, one graphene section can include the dielectric material adjacent thereto with an electrical contact region and the graphene region sandwiching the dielectric material therebetween. Each graphene structure can be a graphene region with about 1-3 atomic layers of graphene. Thus, each structure described herein of the same material or type can be a region of that material or type having multiple atomic layers thereof.

In one embodiment, the graphene intra-cavity absorber can have two graphene regions that sandwich a dielectric material therebetween, where the graphene regions are electronically coupled to electrical leads for power and modulation. The graphene intra-cavity absorber can be located in various positions in the VCSEL relative to the active region, mirrors, and other features of a VCSEL device; however, the location can be preferred to be an intra-cavity location. In one aspect, the graphene intra-cavity absorber can be located within a dielectric mirror, so as to have a dielectric mirror above and below the graphene intra-cavity absorber. For orientation purposes, the substrate is considered to be the bottom and the top having the light-emitting aperture, which is opposite of the substrate. In one aspect, the graphene intra-cavity absorber can be between the active region and the top mirror. In one aspect, the graphene intra-cavity absorber can be between the active region and the bottom mirror. Also, various active or inactive VCSEL semiconductor regions can be positioned between the graphene intra-cavity absorber and the mirrors, active region, or other VCSEL semiconductor region. The graphene intra-cavity absorber can be located anywhere that powering the graphene intra-cavity absorber can modulate the light being emitted from the VCSEL, and where electric leads can be electronically coupled to the graphene regions of the graphene intra-cavity absorber.

In one embodiment, the VCSEL is configured with an electrically modulated intra-cavity graphene absorber. The intra-cavity graphene absorber can be internal or inside the VCSEL. The modulation of electrical bias can electrically modulate absorption of the laser light in order to function as a modulator. In one aspect, the electrically modulated intra-cavity graphene absorber is not a graphene based external absorber and is not located externally.

The VCSEL configured with an electrically modulated intra-cavity graphene absorber can operate with higher bandwidth compared to other VCSELs with direct current modulation in order to facilitate higher bandwidth optical communications applications.

In one aspect, the graphene intra-cavity absorber can be included within a top mirror of the VCSEL so as to be between an upper top mirror portion and a lower top mirror portion. The top mirror can be dielectric or semiconductor. In one aspect, the upper top mirror portion can have more mirror periods or be dimensionally thicker than the lower top mirror portion. In one aspect, the upper top mirror portion can have about the same mirror periods or be dimensionally similar to the lower top mirror portion. In one alternative aspect, the upper top mirror portion can have fewer mirror periods or be dimensionally thinner than the lower top mirror portion. However, the upper and lower top mirror portions can have the same thickness and/or same number of mirror periods in some instances.

Accordingly, many VCSEL and graphene intra-cavity absorber design parameters can be varied to optimize functionalization. For example, some parameters that can be modulated include maximum modulation depth, output power, lasing threshold, and electrical resistance, which may be manipulated and optimized by the number of semiconductor and dielectric mirrors included in the VCSEL and adjacent to the top and/or bottom of the graphene intra-cavity absorber as well as the graphene section placement between the semiconductor and dielectric mirrors. Also, optimal design of the VCSEL and graphene intra-cavity absorber design can depend on lasing wavelength.

In one aspect, the graphene intra-cavity absorber is an electrically modulated absorber that includes a top graphene region and a bottom graphene region with a dielectric region therebetween. The dielectric region in the graphene intra-cavity absorber can be referred to as the intra-cavity absorber dielectric. The intra-cavity absorber dielectric can be any dielectric material. In one aspect, the intra-cavity absorber dielectric can be a dielectric mirror, such as with one or more dielectric mirror periods. Any dielectric mirror known or developed in the art of VCSELs can be employed as the intra-cavity absorber dielectric mirror.

The graphene intra-cavity absorber, such as with the intra-cavity absorber dielectric mirrors, can be beneficial by reducing the number of semiconductor mirrors used in the VCSEL compared to VCSELs without the graphene intra-cavity absorber. The thickness of the semiconductor mirrors can be reduced, and/or the number of semiconductor mirror periods can be reduced in comparison.

In one aspect, the graphene intra-cavity absorber can include a bottom contact region, a dielectric on the bottom contact region, and a top graphene region. Here, the bottom graphene region is substituted with a bottom contact region. As such, the graphene intra-cavity absorber may only have a single graphene region, which can be the top region of the graphene intra-cavity absorber. The bottom contact region can be any known VCSEL contact region. Alternatively, the graphene intra-cavity absorber can be inverted with the bottom region being the graphene region and the top region being the contact region, where the dielectric region is located therebetween.

In one aspect, the semiconductor portion of the VCSEL that is associated with the graphene intra-cavity absorber can be any known or developed VCSEL configuration. This allows any VCSEL of any reasonable wavelength (e.g., 850 nm to 1.5 microns) to include the graphene intra-cavity absorber as described herein. In one example, the VCSEL having the graphene intra-cavity absorber can be configured for operation at 1300 nm. Also, the graphene intra-cavity absorber can operate at any VCSEL operating temperature, which allows the graphene intra-cavity absorber to be employed in any VCSEL operating at any operating temperature. The optical absorption of the graphene section(s) of the graphene intra-cavity absorber has a significantly smaller temperature dependence compared to other absorption modulation devices, such as those that use near resonance absorption in semiconductor quantum wells.

A first embodiment of a VCSEL structure having the graphene intra-cavity absorber is described to include a substrate, a bottom mirror region (e.g., semiconductor mirror) over the substrate, an active region over the bottom mirror region, a top mirror region (e.g., semiconductor mirror) over the active region, an oxide aperture within the top mirror region, a contact region over the top mirror region, a dielectric region over the contact region, a graphene region over the dielectric region, and a dielectric mirror stack over the graphene region. The VCSEL can have electrical contacts with the substrate and contact region to operate the VCSEL. The VCSEL can also have a contact associated with the graphene region. In one option, the substrate can be excluded and/or the bottom mirror region can be coupled with the bottom contact.

In one embodiment, the graphene intra-cavity absorber can be used in oxide confined VCSELs for high speed transceivers. The figures provided herein illustrate how a graphene intercavity modulator can be used together with an oxide VCSEL in a high speed application. However, a graphene intra-cavity absorber or other graphene intra-cavity modulating layer can provide improved modulation characteristics in other VCSEL configurations that have other advantages over oxide confined devices. As such, the graphene intra-cavity absorber can be used an any of these VCSEL configuration.

In one embodiment, the graphene intra-cavity absorber can be used in a buried tunnel junction VCSEL. These VCSELs use a buried high doped P layer, covered by an N mirror. In one aspect, this approach can include a manufacturing regrowth step, and where the device geometry is fully defined by lithographic processes. This type of VCSEL design approach with the graphene intra-cavity absorber can be used in InP based VCSELs, where lateral oxidation is not available. In another aspect, the graphene intra-cavity absorber can be used in high power GaAs devices because of the fundamentally lower thermal resistance. In one aspect, the graphene intra-cavity absorber can overcome the modulation speed limitations because of the excess capacitance associated with the reverse biased junction.

In one embodiment, high power designs in the graphene intra-cavity absorber may also have larger active diameters than what is described in the examples provided herein. For example, high power designs can include the active diameter being perhaps as large as or about 50-100 microns. In one example, such devices may not be used in conventional fiber optic communication applications, but may have other free space communication applications.

In one embodiment, the graphene intra-cavity absorber can be used in an implant VCSEL. For example, a small implant VCSEL could be used instead of an oxide confined device to simplify processing. Today, implant VSCELs are not used in high speed applications>1 Gpbs because of low speed an erratic LI characteristics. Now, however. the implant VCSELs can be used in high speed applications when configured with the graphene intra-cavity absorber.

Figure 1B:
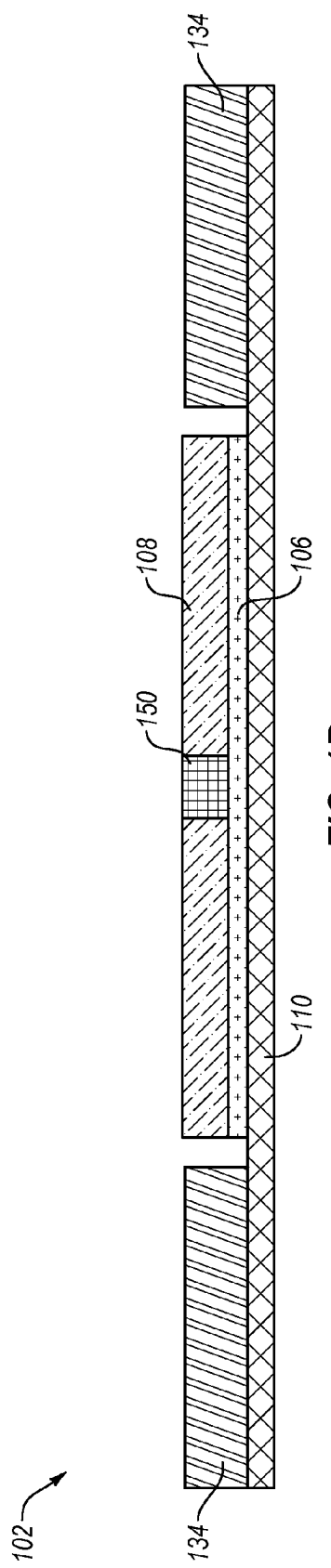
FIG. 1B illustrates an embodiment of a cross-sectional profile of the graphene intra-cavity absorber.
Figure 1C:
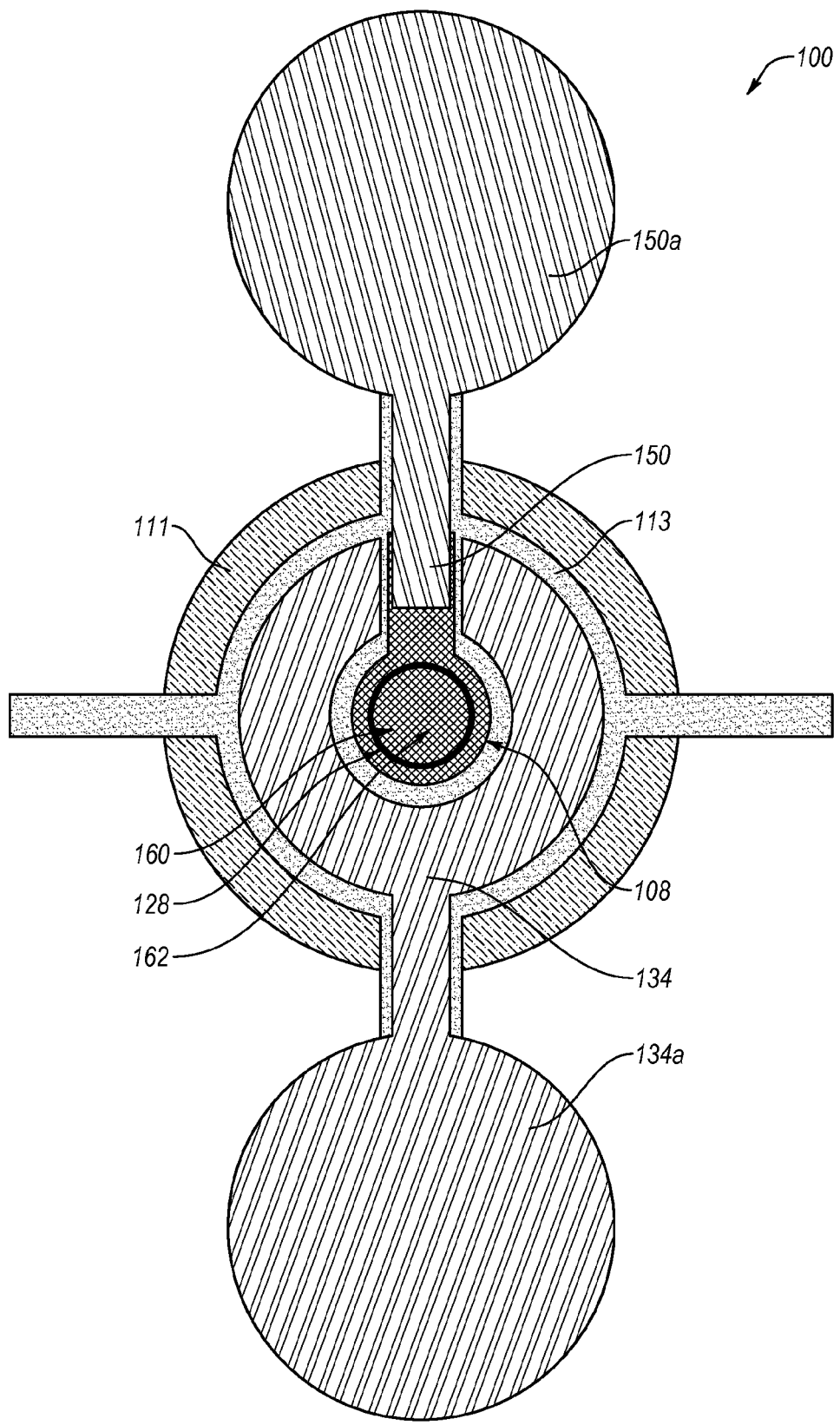
FIG. 1C illustrates a top view of an embodiment of a VCSEL.

FIG. 1A shows a cross-sectional profile of the first embodiment of the VCSEL 100 in accordance with the present technology. While general features of the VCSEL 100 are shown, any additional regions or modifications known in the art of VCSELs can be employed, where one or more VCSEL regions may be located between the illustrated regions. FIG. 1A generally shows the features of the first embodiment of the VCSEL with a graphene intra-cavity absorber 102 that uses a contact region 110 as the bottom region, a dielectric region 106 as the intra-cavity absorber dielectric and a graphene region 108 as the top region of the graphene intra-cavity absorber 102. The VCSEL 100 also includes: a bottom electrode 120; bottom mirror stack 122 over the bottom electrode 120; an active region 124 over the bottom mirror stack 122; a spacer region 126 over the active region 124; an oxide aperture 128 over the spacer region 126; a top mirror stack 130 over the oxide aperture 128; the graphene intra-cavity absorber 102 over the top mirror stack 130; and a dielectric mirror stack 132 over the graphene intra-cavity absorber 102. Also, a top electrode 134 is in contact with the contact region 110. The graphene intra-cavity absorber 102 is electronically coupled to a graphene electrode 150, as shown in FIGS. 1B-1C; where the graphene electrode 150 is on the front side of the VCSEL and shown to be viewable in FIG. 1A. The graphene electrode 150 can be electronically coupled to a graphene electrode contact pad 150a as per FIG. 1C. Any electrode configuration can be used for the bottom electrode 120, top electrode 134, and graphene electrode 150.

The contact region 110 as the bottom region of the graphene intra-cavity absorber 102 can be any type of VCSEL contact region. In one example, the contact region includes a P+ (e.g., $8 \times 10^{19}/cm^3$) doped AlGaAs contact region with a thickness of about ~50 nm. The contact region 110 allows low-resistance electrical contact between the top electrode 134 and VCSEL semiconductor regions on the P side. In this embodiment, the P+ contact region 110 is also used to apply E-field to the graphene region 108 of the graphene intra-cavity absorber 102. Use of such a contact region 110 can be implemented for making P contacts in GaAs VCSELs.

The dielectric region 106 as the graphene intra-cavity absorber dielectric of the graphene intra-cavity absorber 102 can be located between the graphene region 108 and the contact region 110 that is coupled to the top electrode 134. The dielectric region 106 can be a higher dielectric constant material, such as tantalum pentoxide or titanium dioxide, which can be preferred. Also, any dielectric material or combination of materials or dielectric region combinations, such as a dielectric mirror stack can be used. The dielectric region 106 can have a thickness of about 5-20 nm. However, a smaller thickness may be used. For a small thickness of the dielectric region 106, atomic layer deposition can be used for manufacturing.

It has been found that the dielectric region 106 can be modulated with high dielectric constant material and smaller thicknesses can allow for lower modulation voltage. The graphene intra-cavity absorber 102 can include the dielectric with a high dielectric constant and smaller thickness, which can lead to a lower modulation voltage, and which be used to calculate the parameters of the graphene intra-cavity absorber 102. Preferably, only a few volts modulate the graphene intra-cavity absorber 102, but capacitance can be maximized. Under the design parameters described herein, the electrical capacitance of the structure is maximized.

The graphene region 108 is the top region of the graphene intra-cavity absorber 102. The graphene region 108 can be a single layer or multiple layers (e.g., one, two, or three atomic layers) of graphene. The graphene region 108 can be placed at a cavity standing wave field maximum. The graphene region 108 can be coupled with a graphene electrode 150 (shown in FIGS. 1B-1C), where modulation voltage is applied to the graphene electrode 150 to modulate the graphene intra-cavity absorber 102. The graphene electrode 150 can be referred to as electrode 3. The thickness of each atomic layer of graphene can be about 3.8 angstroms, and thereby the atomic layer can be multiplied by the number of graphene atomic layers in the graphene region 108 (e.g., 3.8×# atomic layers). Application of voltage to the graphene electrode 150 can create an electric field that drives a large change in optical absorption of the graphene region 108. The diameter of the graphene region 108 can be about the same as the dielectric mirror stack 132, which graphene region 108 can have a diameter as small as 8 microns, or 3-4 microns larger than the oxide aperture 128. The oxide aperture 128 can have an aperture diameter of about 4-5 microns for a single optical mode VCSEL, and thereby the diameter of the corresponding graphene region 108 can be about 7, 8, or 9 microns. The small diameter of the graphene region 108 can facilitate low capacitance and allow high-speed modulation. Single-mode operation can also be useful for high-speed fiber optic devices. In one aspect, the VCSEL can be 1300 nm using single-mode fiber at its minimum dispersion point.

The bottom electrode 120 can be a solid member (e.g., not annular or ring), and may be referred to as electrode 2. The bottom electrode 120 can be used for VCSEL DC drive current. When the top electrode 134 (i.e., electrode 1) is an anode, the bottom electrode (e.g., electrode 2) will be a cathode, or vice versa.

The bottom mirror stack 122 can be over the bottom electrode 120 or substrate (not shown). The bottom mirror stack 122 can be a bottom semiconductor mirror stack. The bottom mirror stack can be a section that defines an end to the optical cavity of the VCSEL 100. This bottom mirror stack 122 can be a N-type semiconductor material, in part because of advantages in volume manufacturing and reliability. However, the bottom mirror stack 122 may be P-type semiconductor, which corresponding modifications to the type of the other semiconductor regions in the VCSEL. Also, a graphene intra-cavity absorber VCSEL 100 can also have an N-mirror as the top mirror stack 130 and P-mirror as the bottom mirror stack 122 to reduce conductivity of the contact region 110.

The active region 124 over the bottom mirror stack 122 can be any type of active region with quantum wells and quantum well barriers, and any other feature of an active region. The active region 124 can allow for current flowing through the VCSEL to be DC current. Design of quantum wells of the active region 124 can depend on target wavelength emission of the VCSEL 100.

The spacer region 126 over the active region 124 can be any type of region used in VCSELs between an active region 124 and oxide aperture 128. In one aspect, the oxide aperture 128 can be embedded in the top mirror stack 130 so that the spacer region 126 is a lower portion of the top mirror stack 130, and the portion over the oxide aperture 128 is an upper portion of the top mirror stack 130.

The oxide aperture 128 can be any type of oxide aperture. Such oxide apertures are known in modern VCSELs, and any type prepared by any manufacturing method can be used. The oxide aperture 128 can be configured and dimensioned so that electrical current is forced into a center region of the VCSEL 100, where the center region is longitudinally aligned with the aperture of the oxide aperture 128. The oxide aperture 128 can have an aperture diameter of about 4-5 microns for a single optical mode VCSEL device. The oxide aperture 128 allows for a lower threshold and higher efficiency operation. Similar to a standard VCSEL, alternate embodiments can include ion implantation to define the aperture, or an etched pillar design to define the aperture.

The top mirror stack 130 can be a P-type semiconductor mirror stack. In one example, the semiconductor mirror stack can include alternating regions or layers of AlGaAs/GaAs as mirror pairs. The thickness of the top mirror stack 130 can be determined by wavelength to be emitted. Also, the thickness of the top mirror stack 130 can include the top portion above the oxide aperture 128 or it can include the entire top mirror stack 130 with the upper portion above the oxide aperture 128 and lower portion (e.g., 126) below the oxide aperture 128. In combination with the dielectric mirror stack 132, the regions or layers of the top mirror stack 130 provide enough reflectivity for operation as a VCSEL.

In one embodiment, about 10-13 mirror pairs can be used for the upper portion or entire top mirror stack 130. In other comparative VCSELS without the graphene intra-cavity absorber, there can be usually about 23 mirror pairs.

As is standard for VCSELs, the semiconductor mirror regions of the top mirror stack 130 can conduct current to the active region 124. This can include the upper and/or lower portions of the top mirror stack 130 (e.g., 130 and 126).

In embodiments at different wavelengths, different combinations of semiconductor and dielectric mirrors may be used. Accordingly, the combination of dielectric mirror stack 132 and top mirror stack 130 can be modified, such as the relative compositions as well as the relative thickness and distance apart can be modified. Also, the location of the graphene region 108 and graphene intra-cavity absorber 102 can be adjusted relative to the dielectric mirror stack 132 and semiconductor top mirror stack 130 for modulation of operating conditions of the VCSEL 100.

The dielectric mirror stack 132 over the graphene intra-cavity absorber 102 can be any dielectric mirror stack. In one example, the dielectric mirror stack can be about 6-8 pairs of dielectric mirror regions, such as when the top mirror stack 130 (e.g., semiconductor) is about 10-13 mirror pairs. The dielectric mirror stack 132 can include $SiO_2/SiN_x$ pairs, which can be deposited by PECVD. In one example, the dielectric mirror stack 132 can include a thicknesses of $SiO_2$ being about 104 nm and $SiN_x$ being about 145 nm, such as when operating at 850 nm wavelength. Other materials deposited by E-beam sputtering can also be used depending on requirements of the graphene region 108. Thicknesses of the mirror regions, mirror pairs, or dielectric mirror stack 132 can be modified depending on index of refraction and operating wavelength.

Also, the top electrode 134 is in contact with the contact region 110. The top electrode 134 can be referred to as electrode 1. In one example the top electrode 134 can be an annular ring or portion thereof (e.g., "C" shaped). The top electrode 134 can be any suitable material, where gold is an example. As shown, the top electrode 134 serves as both an anode contact for the VCSEL DC drive current and as a second connection for the graphene intra-cavity absorber 102.

FIG. 1C shows an embodiment of a top view of the VCSEL 100 of FIG. 1A. As shown, the VCSEL 100 includes the graphene region 108 in the central region 160, which is aligned with the aperture 162 of the oxide aperture 128. The graphene region 108 is electrically coupled with a graphene electrode 150, which is electrically coupled with a graphene electrode contact pad 150a. The top electrode 134 is electrically coupled with a top electrode contact pad 134a. The VCSEL 100 can include an etched trench 111, which can be used to define the mesa 113 of the VCSEL 100, and allowing lateral oxidation to produce the oxide aperture 128.

In one embodiment, a VCSEL configured with an implant or buried tunnel junction can be devoid of an etched trench.

Figure 2:
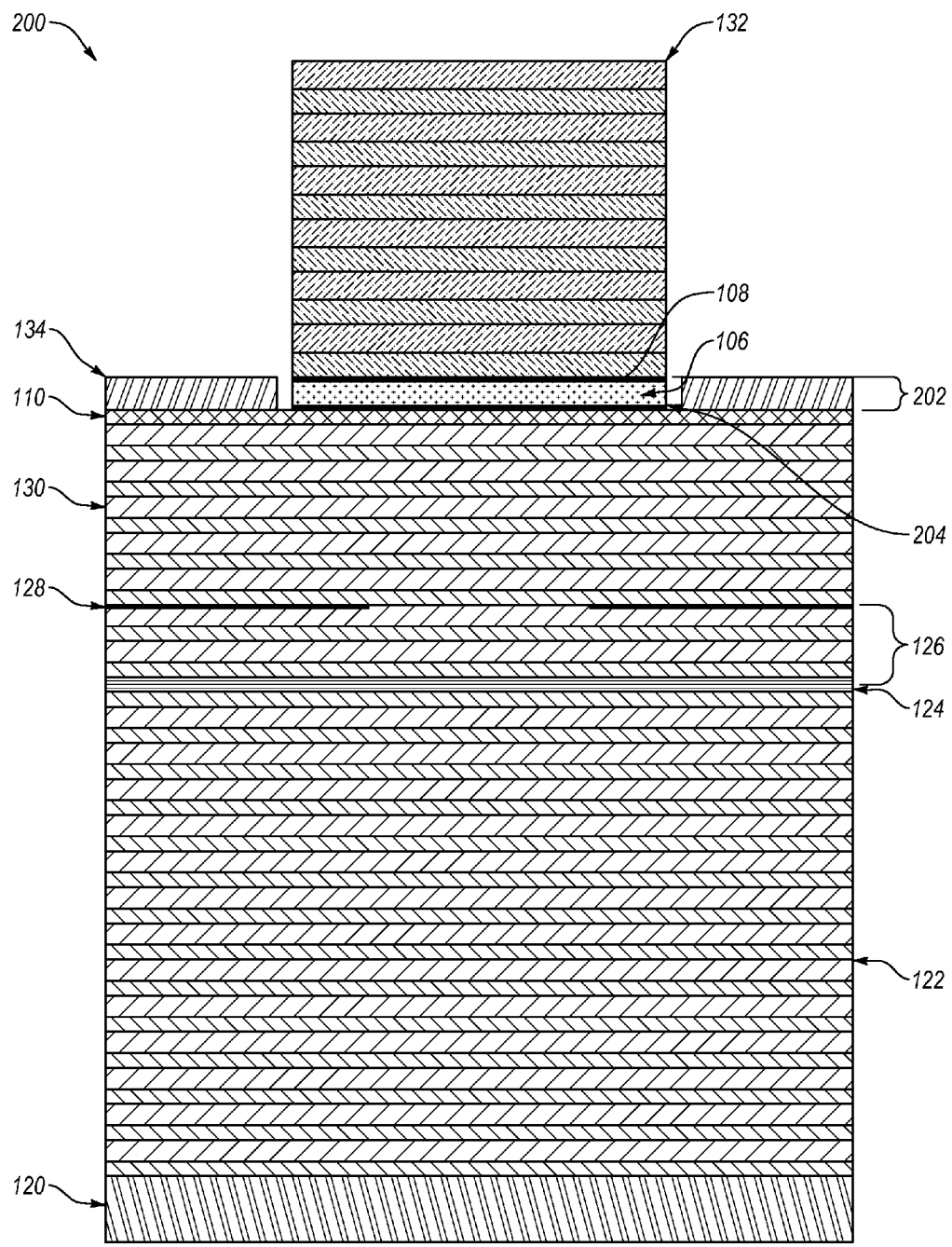
FIG. 2 illustrates a cross-sectional profile of an embodiment of a VCSEL having a graphene intra-cavity absorber that includes two regions of graphene sandwiching a dielectric region.
Figure 2C:
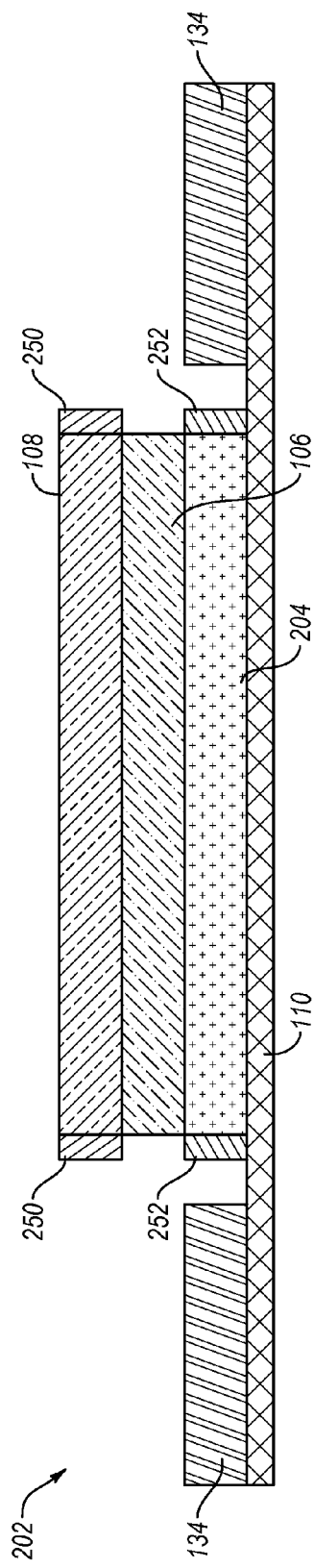
FIG. 2C illustrates an embodiment of a graphene intra-cavity absorber in direct contact with a contact region and corresponding electrodes that can be used in a VCSEL.
Figure 2D:
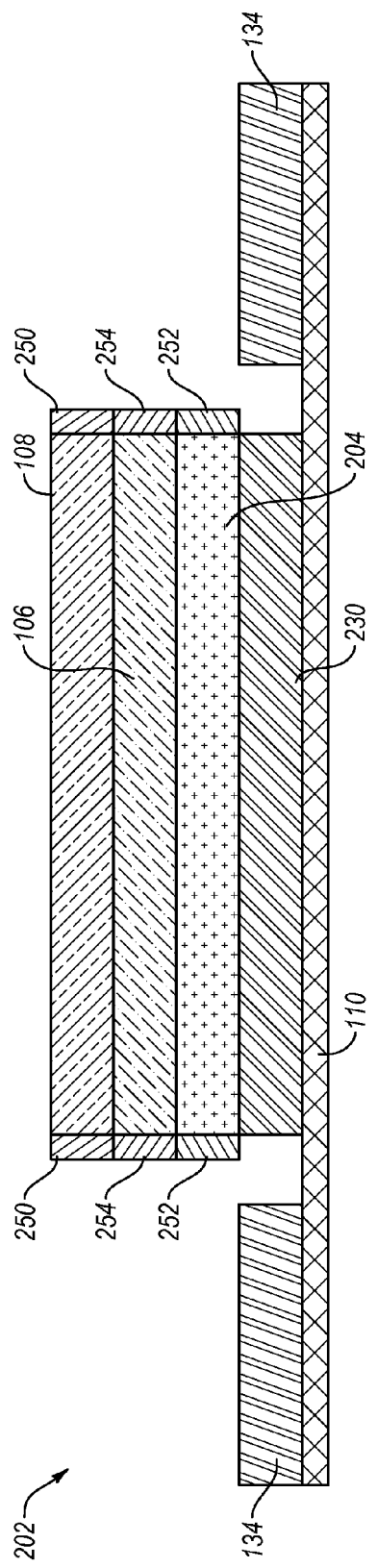
FIG. 2D illustrates an embodiment of a graphene intra-cavity absorber with an electrically insulating region between the graphene intra-cavity absorber and contact region and independent electrodes for the graphene intra-cavity absorber that can be used in a VCSEL.

FIG. 2 shows another embodiment of a VCSEL 200 having a graphene intra-cavity absorber 202. Here, the graphene intra-cavity absorber 202 includes a bottom graphene region 204, a dielectric region 106 on the bottom graphene region 204, and a top graphene region 108 on the dielectric region 106. The graphene intra-cavity absorber 202 is configured with a bottom graphene region 204, and accordingly, the contact region 110 under the bottom graphene region 204 may or may not be considered to be part of the graphene intra-cavity absorber 202. In one instance, the bottom graphene region 204 is electrically coupled (e.g., in contact with or with electrically conducting regions therebetween) with the contact region 110, and thereby it applies the E-field to the bottom graphene region 204. In another instance, the bottom graphene region 204 is electrically isolated from the contact region 110 with one or more electrical insulating regions therebetween (not shown), and a bottom graphene electrode (not shown) is electrically coupled with the bottom graphene region 204. The bottom graphene region 204 can be configured to be identical to the top graphene region 108. Alternatively, the bottom graphene region 204 may be different from the top graphene region 108. However, the bottom graphene region 204 can be a single layer or multiple layers (e.g., one, two, or three atomic layers) of graphene. Optionally, the bottom graphene region 204 can be placed at a cavity standing wave field maximum, or the maxima can be at the top graphene region 108, or the maximum can be within the dielectric region 106. The thickness of each atomic layer of graphene can be about 3.8 angstroms, and thereby the atomic layer can be multiplied by the number of graphene atomic layers in the bottom graphene region 204 (e.g., 3.8×# atomic layers). The diameter of the bottom graphene region 204 can be about the same as the dielectric mirror stack 132, which bottom graphene region 204 can have a diameter as small as 8 microns, or 3-4 microns larger than the oxide aperture 128, such as being about 7, 8, or 9 microns. The small diameter of the bottom graphene region 204 can facilitate low capacitance and allow high-speed modulation. Single-mode operation can also be useful for high-speed fiber optic devices. In one aspect, VCSEL can be 1300 nm using single-mode fiber at its minimum dispersion point. The top graphene region 108 can be configured as described herein. The top graphene region 108 can be operably coupled to a top graphene electrode 250 and the bottom graphene region 204 can be coupled to a bottom graphene electrode 252 as shown in FIGS. 2C-2D.

In one embodiment, each graphene region of the graphene intra-cavity absorber 202 can include 1-3 atomic layers of graphene for the top graphene region 108 and/or bottom graphene region 204. The dielectric region 106 can be a thin structure or region (e.g., about 5-20 nm) of any dielectric material. In FIG. 2, the top and bottom graphene electrodes that are connected to the top and bottom graphene regions, respectively, are not shown, but they are shown in FIGS. 2C-2D. The VCSEL 200 having the graphene intra-cavity absorber 202 in the form of a graphene sandwich can be useful in order to get more modulation depth in the VCSEL. In one aspect, the optical absorption of the graphene regions (e.g., 204 and/or 108) can be "turned off" by applying an electric field in either direction. Therefore, both graphene regions 204 and 108 in the graphene intra-cavity absorber 202 can always be active when no electric field is applied. Optionally, the graphene intra-cavity absorber 202 can be at or in the electric field maximum of the VCSEL 200.

The VCSEL 200 also includes: a bottom electrode 120; bottom mirror stack 122 over the bottom electrode 120; an active region 124 over the bottom mirror stack 122; a spacer region 126 over the active region 124; an oxide aperture 128 over the spacer region 126; a top mirror stack 130 over the oxide aperture 128; the graphene intra-cavity absorber 102 over the top mirror stack 130; and a dielectric mirror stack 132 over the graphene intra-cavity absorber 102. Also, a top electrode 134 is in contact with the contact region 110. Optionally, these features can be identical as recited in connection to FIG. 1A, or they may be configured as any other VCSEL.

In the VCSEL 200, the top electrode 134 may be used for only DC bias of the VCSEL when the bottom graphene region 204 has a bottom graphene electrode.

In the VCSEL 200, the top electrode 134 may be used for both DC bias of the VCSEL and to apply an E-field to the bottom graphene region 204 when the bottom graphene region 204 does not have a bottom graphene electrode.

FIG. 2A illustrates the graphene intra-cavity absorber 202 with the bottom graphene region 204 on and in electrical contact with the contact region 110.

FIG. 2B illustrates the graphene intra-cavity absorber 202 with the bottom graphene region 204 electrically isolated from the contact region 110 by having an insulating region 230 between the bottom graphene region 204 and the contact region 110.

FIG. 2C illustrates the graphene intra-cavity absorber 202 with the bottom graphene region 204 on and in electrical contact with the contact region 110. Here, the top graphene electrode 250 is shown to be electrically coupled to the top graphene region 108.

FIG. 2D illustrates the graphene intra-cavity absorber 202 with the bottom graphene region 204 electrically isolated from the contact region 110 by having an insulating region 230 between the bottom graphene region 204 and the contact region 110. Here, the top graphene electrode 250 is shown to be electrically coupled to the top graphene region 108, and the bottom graphene electrode 252 is shown to be electrically coupled to the bottom graphene region 204. Both the graphene electrodes 250, 252 can be configured as described herein, where the electrode can have an annular or "C"-shaped portion coupled with the graphene regions. Optionally, one or more electrically insulating regions 254 can be located between the top graphene electrode 250 and the bottom graphene electrode 252.

Figure 3:
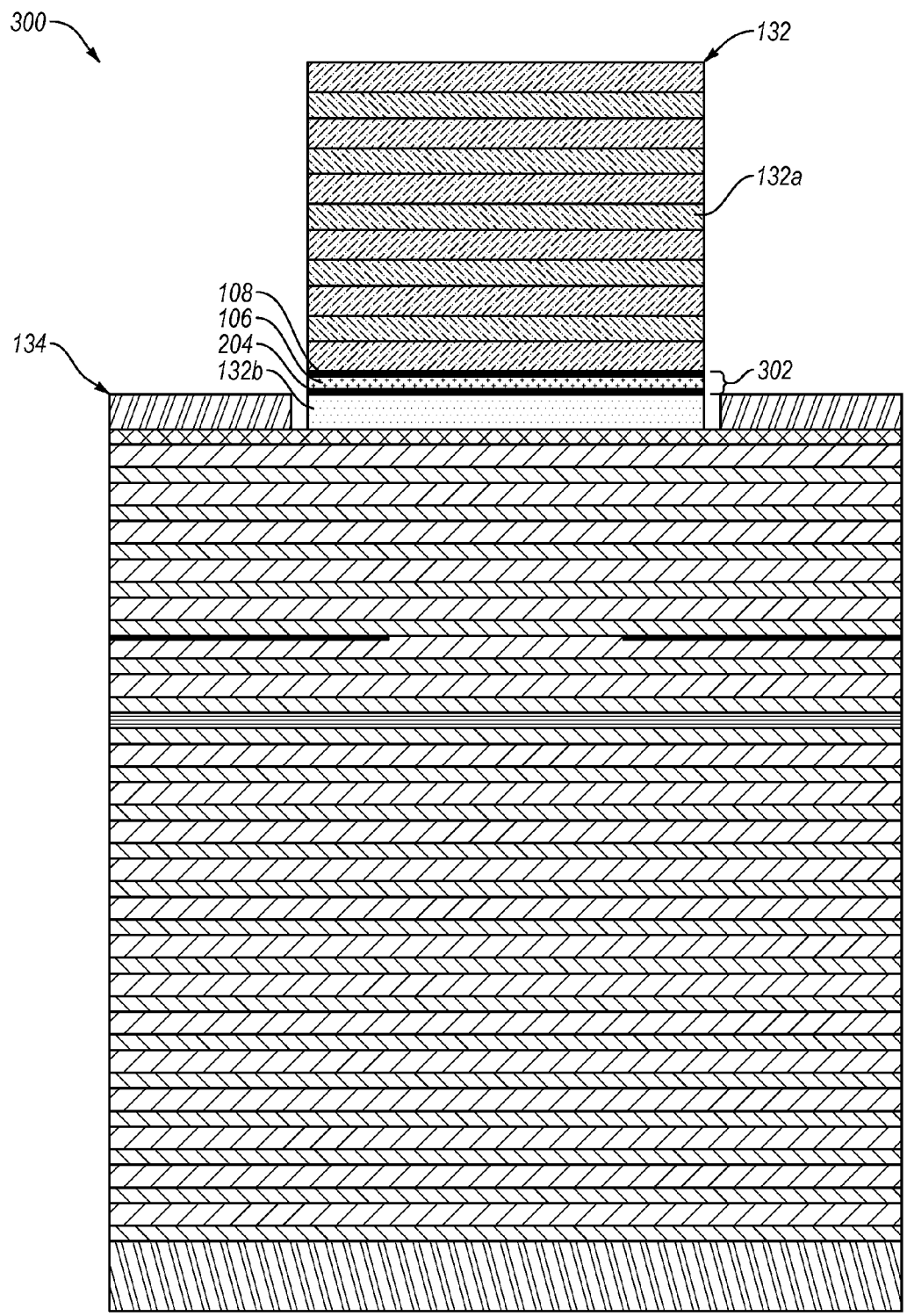
FIG. 3 illustrates a cross-sectional profile of an embodiment of a VCSEL having a graphene intra-cavity absorber that includes two regions of graphene sandwiching a dielectric region, where the graphene intra-cavity absorber is within a dielectric mirror.

FIG. 3 shows another embodiment of a VCSEL 300 having a graphene intra-cavity absorber 302. Here, the graphene intra-cavity absorber 302 includes a bottom graphene region 204, a dielectric region 106 on the bottom graphene region 204, and a top graphene region 108 on the dielectric region 106. The graphene intra-cavity absorber 302 is configured with a bottom graphene region 204 that is electrically isolated from the contact region 110. As shown, the graphene intra-cavity absorber 302 is located within the dielectric mirror stack 132, such that a top dielectric mirror stack portion 132a is above the graphene intra-cavity absorber 302 and a bottom dielectric mirror stack portion 132b is below the graphene intra-cavity absorber 302. The bottom graphene region 204 is electrically isolated from the contact region 110 by the bottom dielectric mirror stack portion 132b. The graphene intra-cavity absorber 302 can be configured as described herein. The bottom dielectric mirror stack portion 132b can have one or more dielectric mirror pairs, which may be fewer, the same, or more than the dielectric mirror pairs of the top dielectric mirror stack portion 132a.

Figure 3A:
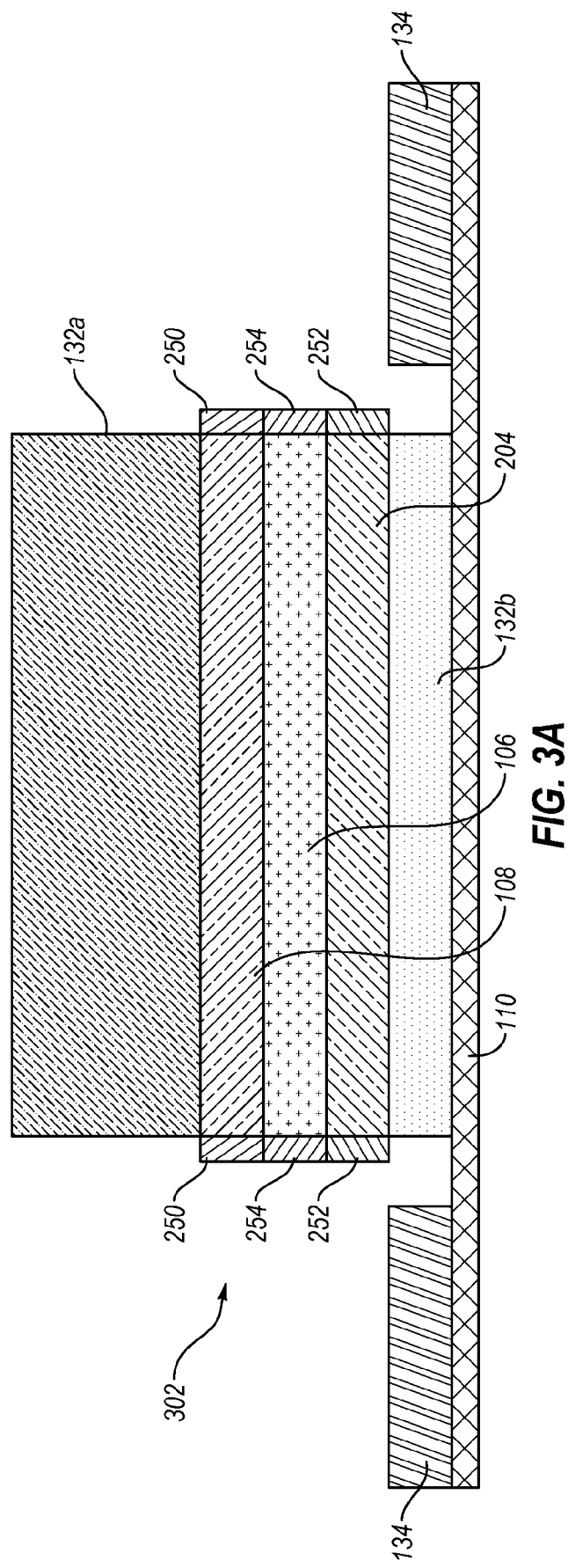
FIG. 3A illustrates an embodiment of a graphene intra-cavity absorber having independent electrodes within a dielectric mirror.

The top graphene region 108 can be operably coupled to a top graphene electrode 250 and the bottom graphene region 204 can be coupled to a bottom graphene electrode 252 as shown in FIG. 2D or 3A.

In one aspect, the graphene intra-cavity absorber 302 can be located in the dielectric mirror stack 132 so that the bottom graphene region 204 can be placed at a cavity standing wave field maximum, or the maximum can be at the top graphene region 108, or the maximum can be within the dielectric region 106. The electrodes for the graphene regions can be configured as described herein.

The VCSEL 300 having the graphene intra-cavity absorber 302 in the form of a graphene sandwich within the dielectric mirror stack 132 can be useful in order to get more modulation depth in the VCSEL. In one aspect, the optical absorption of the graphene regions (e.g., 204 and/or 108) can be "turned off" by applying an electric field in either direction. Therefore, both graphene regions 204 and 108 in the graphene intra-cavity absorber 302 will always be active when no electric field is applied. Optionally, the graphene intra-cavity absorber 302 can be at or in the electric field maximum of the VCSEL 300.

The VCSEL 300 can also include features that can be identical as recited in connection to FIG. 1A or FIG. 2, or they may be configured as any other VCSEL.

In the VCSEL 300, the top electrode 134 may be used for only DC bias of the VCSEL because the bottom graphene region 204 has a bottom graphene electrode (not shown).

In one embodiment, each graphene region of the graphene intra-cavity absorber 302 can include 1-3 atomic layers of graphene for the top graphene region 108 and/or bottom graphene region 204. The dielectric region 106 can be a thin structure or region (e.g., about 5-20 nm) of any dielectric material. In FIG. 3, the top and bottom graphene electrodes that are connected to the top and bottom graphene regions, respectively, are not shown. The VCSEL 300 having the graphene intra-cavity absorber 302 in the form of a graphene sandwich can be useful in order to get more modulation depth in the VCSEL. In one aspect, the optical absorption of the graphene regions (e.g., 204 and/or 108) can be "turned off" by applying an electric field in either direction. Therefore, both graphene regions 204 and 108 in the graphene intra-cavity absorber 302 will always be active with high optical absorption when no electric field is applied. As such, the graphene intra-cavity absorber 302 can modulate the emitted light by being turned off (optically absorbing and inhibiting light emission) and turned on (becoming optically transmissive and allowing light emission). Optionally, the graphene intra-cavity absorber 302 can be at or in the electric field maximum of the VCSEL 300.

FIG. 3A illustrates the graphene intra-cavity absorber 302 within the dielectric mirror stack 132 with the bottom graphene region 204 electrically isolated from the contact region 110 by the bottom dielectric mirror stack portion 132b, which is between the bottom graphene region 204 and the contact region 110. The top dielectric mirror stack portion 132a is above the top graphene region 108. Here, the top graphene electrode 250 is shown to be electrically coupled to the top graphene region 108, and the bottom graphene electrode 252 is shown to be electrically coupled to the bottom graphene region 204. Both the graphene electrodes 250, 252 can be configured as described herein, where the electrode can have an annular or "C"-shaped portion coupled with the graphene regions. Optionally, one or more electrically insulating regions 254, which can be dielectric regions, can be located between the top graphene electrode 250 and the bottom graphene electrode 252.

The graphene intra-cavity absorber of the present technology has a significantly reduced cross-sectional profile with smaller dimensions. The cross-sectional dimension (e.g., diameter) can be about 5, 6, 7, 8, 9, or 10 microns, and may be up to 15, 20, 25, or 30 microns in some instances; however, 6-10 microns can be preferred to reduce capacitance. The small cross-sectional dimension is an improvement over the art where previous graphene intra-cavity absorbers have cross-sectional dimensions of 100 microns or greater. The smaller graphene intra-cavity absorber of the present technology is capable of operating at sufficient speeds for advancing data communication rates.

Figure 4:
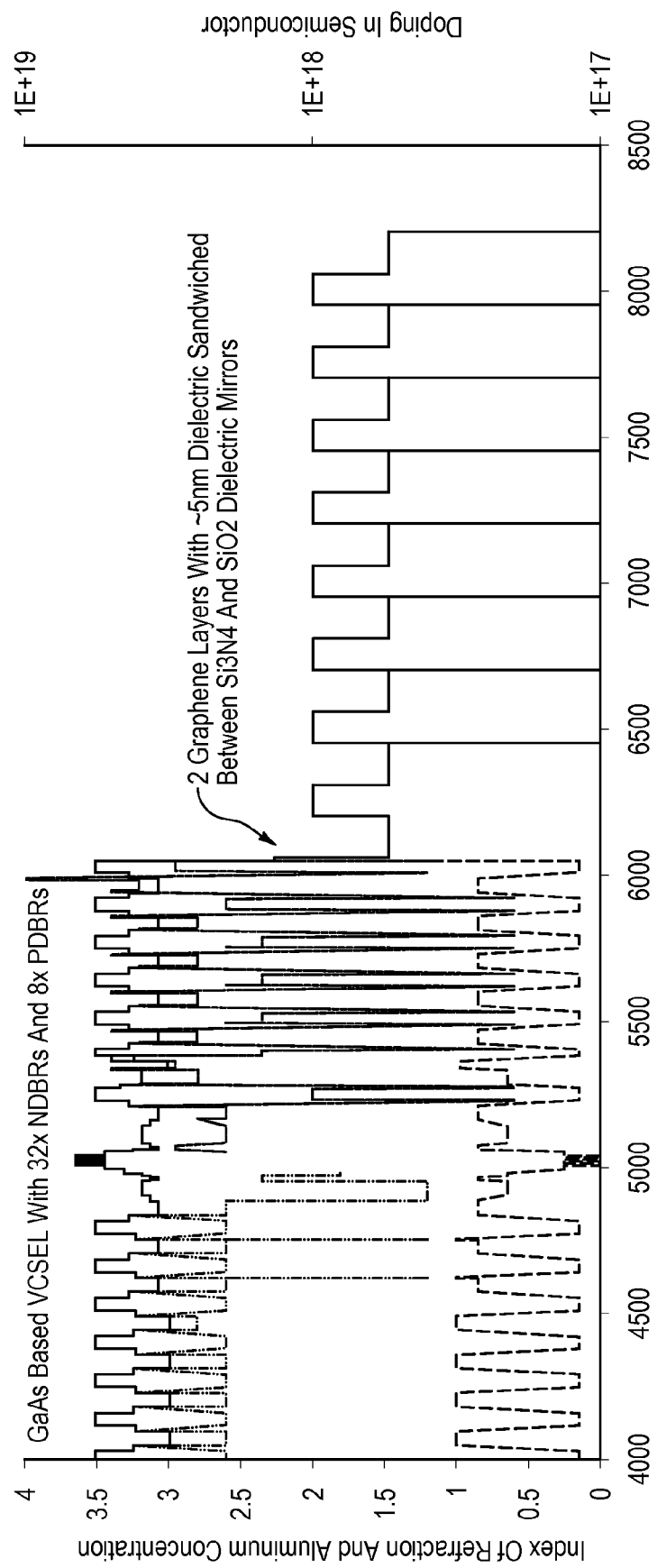
FIG. 4 includes a graph for an embodiment of a graphene intra-cavity absorber along that illustrates the index of refraction and aluminum concentration as a function of location and the doping of the semiconductor.

FIG. 4 includes a graph that shows a diagram of a semiconductor VCSEL structure, graphene layers, and dielectric mirror stack (e.g., dielectric DBR mirror stack). The VCSEL includes a GaAs semiconductor region with 32 layers of N-type AlGaAs bottom DBR mirror stack (NDBR), eight layers of P-type AlGaAs top DBR mirror stack (PDBR), two graphene regions sandwiching a 5-nm dielectric therebetween, and a dielectric mirror stack having $Si_3N_4/SiO_2$ layers over the graphene intra-cavity absorber. The graph shows the index of refraction and Al concentration for the dimension of the device from the bottom (left side) to top (right side). The graph also shows the doping in the mirror regions.

Figure 5:
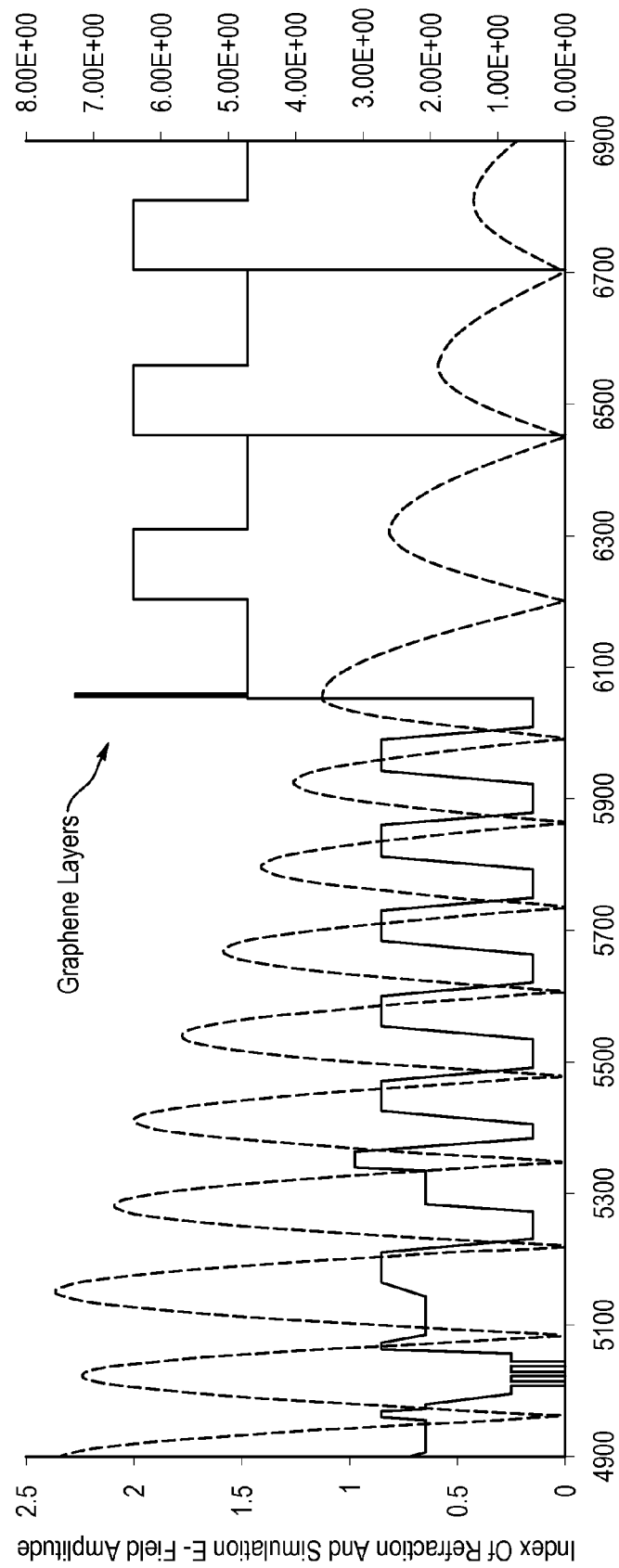
FIG. 5 includes a graph illustrating the index of refraction and E-field amplitude of the graphene intra-cavity absorber of FIG. 4.

FIG. 5 includes a diagram of the index of refraction and simulated E-field amplitude for the VCSEL, where the graphene regions are indicated. This shows the graphene regions, and thereby the graphene intra-cavity absorber, are located at an E-field maximum.

The data for FIGS. 4 and 5 can be obtained from a VCSEL, from top to bottom, having an upper dielectric mirror stack of $Si_3N_4/SiO_2$ layers, a top graphene region, a tantalum pentoxide ($Ta_2O_5$) region, a bottom graphene region, a SiO2 region, a P-type AlGaAs top DBR mirror stack (PDBR) having regions with different amounts of Al (e.g., 15%, 85%), an oxide aperture within the P-type AlGaAs top DBR mirror stack (PDBR), which has 97.5% Al top regions and 65% Al bottom regions, P-type AlGaAs spacer region with alternating 85% Al regions (e.g., P-type upper confining regions) and 65% Al regions, AlGaAs barrier region with 25% Al, quantum wells, AlGaAs barrier region with 25% Al, lower confining region, N-type AlGaAs spacer region with alternating 85% Al regions (e.g., N-type upper confining regions) and 65% Al regions, and N-type AlGaAs bottom DBR mirror stack (NDBR) with various Al concentrations ranging from 65%, 85%, 15%, 100%, and 95%.

In one embodiment, the one or more graphene regions of the graphene intra-cavity absorber can be modified so that the graphene does not extend from edge to edge of the mesa. Such an embodiment can include an annular perimeter portion that has a highly conductive material, such as gold (e.g., microgrid of gold), that defines an aperture and a central portion within the aperture that is graphene. The contact between gold and graphene can be optimized for minimum resistance using appropriate interfacial materials. The contact may be configured so that the interfacial material has an electron affinity in the range of that of graphene, +/−0.2 ev, or less than that of graphene.

In one embodiment, the back reflection into the VCSEL laser cavity can be set so that it does not change by modulating the graphene intra-cavity absorber.

In one embodiment, each graphene region can be considered to be a two-dimensional electron gas of substituted with a two-dimensional electron gas because of the high conductivity and easy electron transport in the plane. This allows the two-dimensional electron gas to expand and fill the plane, but not expand out of the plane. The graphene allows for formation of such an electron gas in the plane of each graphene region.

Figure 6:
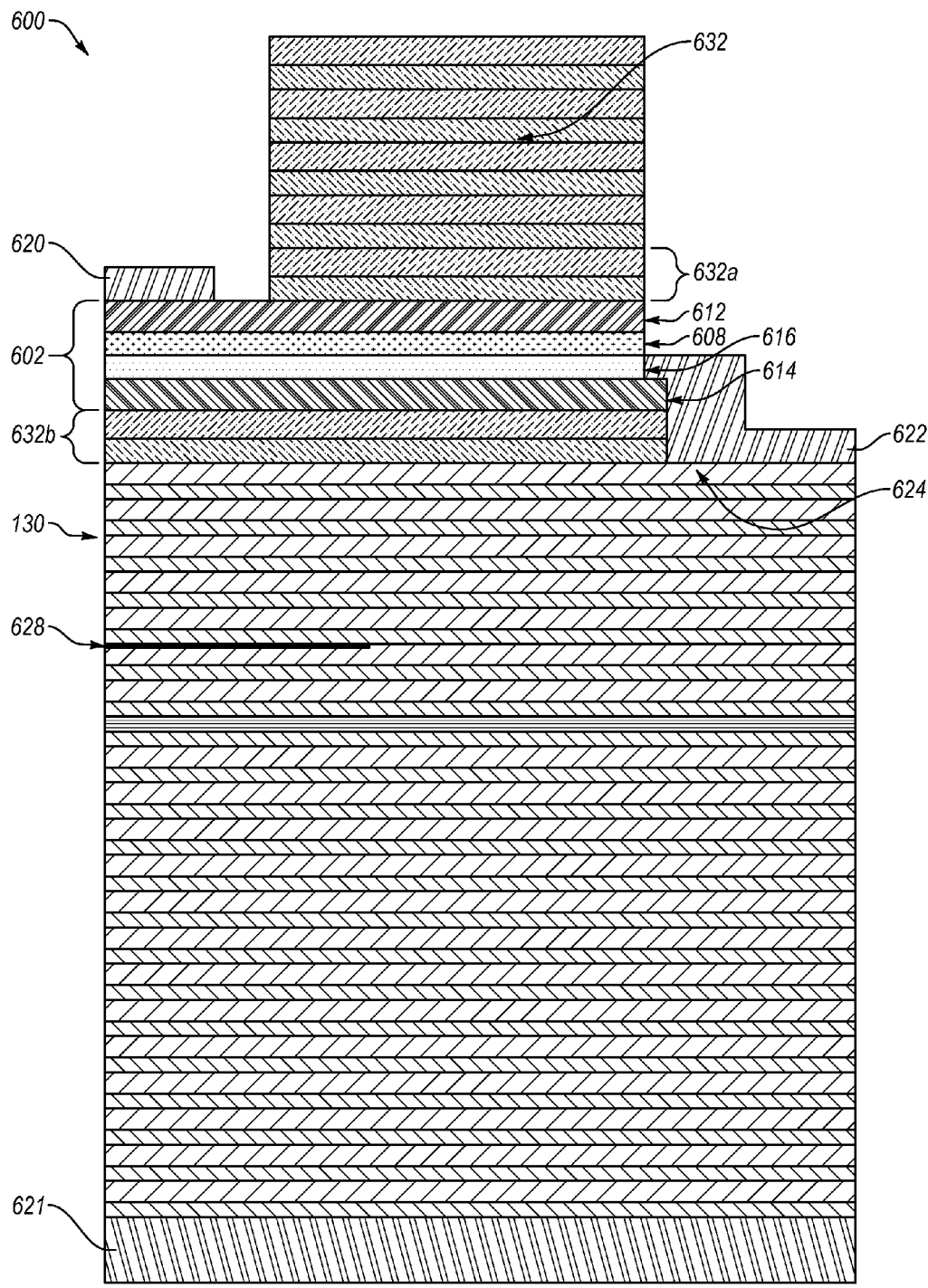
FIG. 6 illustrates a cross-sectional profile of an embodiment of a VCSEL having a graphene intra-cavity absorber with conductive oxide and silicon dioxide regions.

FIG. 6 illustrates an embodiment of a VCSEL 600 having a graphene intra-cavity absorber 602 formed by a graphene region 608 with an upper conductive oxide region 612 above the graphene region 608 and a lower conductive oxide region 614 below the graphene region 608. Also, optionally a silicon dioxide region 616 can be between the graphene region 608 and the lower conductive oxide region 614. The lower conductive oxide region 614 can be on a dielectric region, which can be a lower dielectric mirror portion 632b. The upper conductive oxide region 612 can have an upper dielectric mirror portion 632a thereon. As such, the graphene intra-cavity absorber 602 can be located within a dielectric mirror 632. Also, a first electrode contact 620 is shown to be electrically coupled with the upper conductive oxide region 612, which can be in contact therewith or with conducting regions therebetween. The first electrode contact 620 can be used to drive the graphene intra-cavity absorber 602. Additionally, a second electrode contact 622 is shown to be electrically coupled with the silicon dioxide region 616, lower conductive oxide region 614, and lower dielectric mirror portion 632b, as well as a portion being on a conducting region (not shown) or a mirror region 624 of the top semiconductor mirror 130. The second electrode contact 622 can be used for both modulation of the graphene intra-cavity absorber 602 and light emission of the VCSEL 600, which is similar to the top electrode 134 of FIG. 1A. The third electrode contact 621 can be at the bottom of the VCSEL and can be used similarly as the bottom electrode 120 of FIG. 1A. The rest of the VCSEL 600 can be configured and structured as described herein. Optionally, the oxide region 628 may only be on one side rather than an annular oxide aperture. The active region and bottom semiconductor mirror and bottom electrode can be the same or configured in accordance with any VCSEL. As shown, the graphene can be about 50 angstroms, and may have higher conductivity. The conductive oxide regions 612, 614 can be beneficial by limiting or reducing graphene sheet resistance.

Figure 7A:
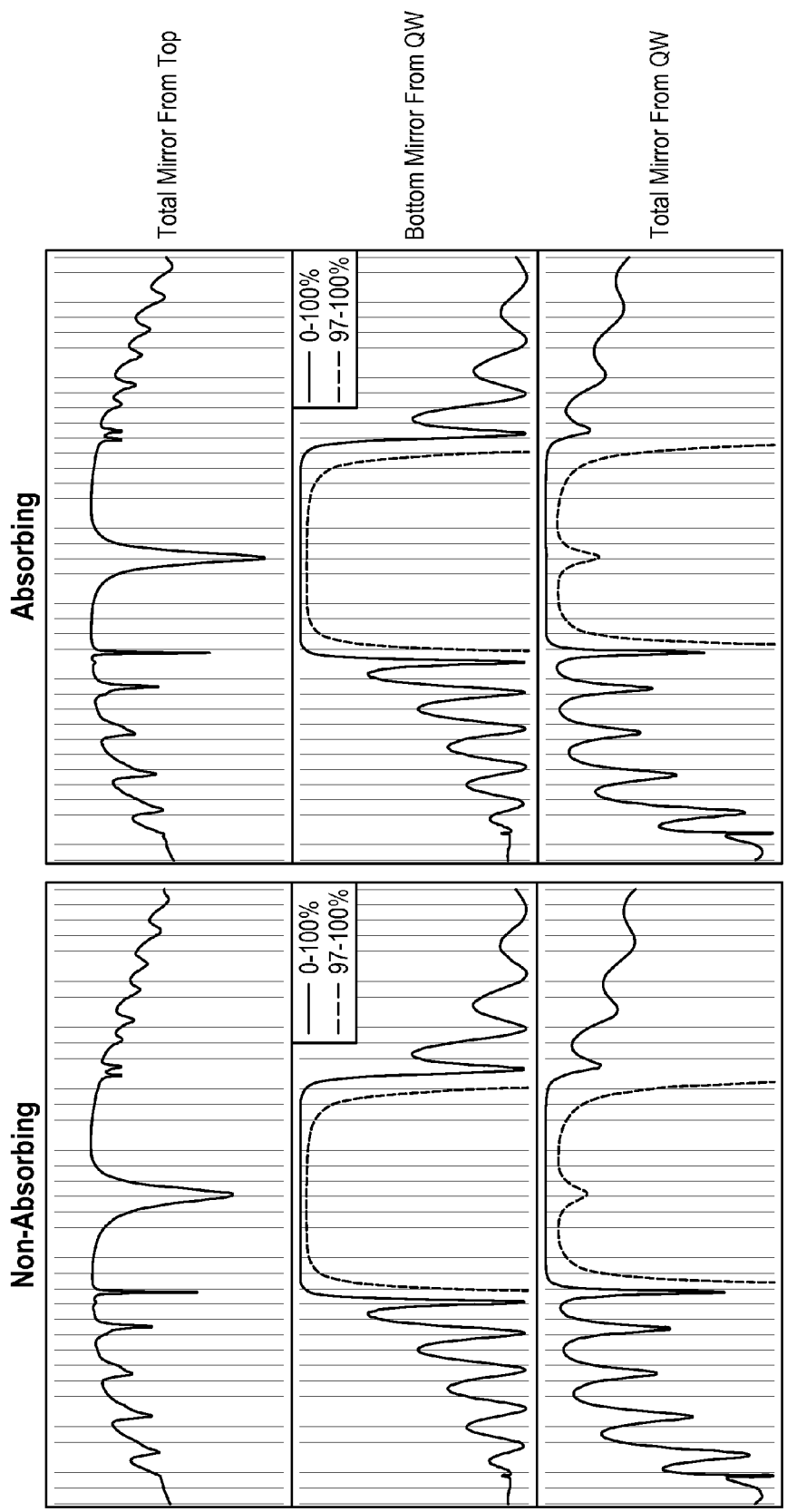
FIG. 7A includes graphs that show non-absorbing and absorbing characteristics of the VCSEL of FIG. 6.

FIG. 7A illustrates graphs showing the reflectance spectra for the VCSEL 600 of FIG. 6 operated with constant gain. The graphene intra-cavity absorber 602 is operated in the non-absorbing state and the absorbing state to illustrate reflectance for modulation states. It is noted that reflectances are the same despite the differences in spectra. This can be important in some embodiments because can eliminate modulation delays related to the coupling of the gain and the photon density in the cavity.

Figure 7B:
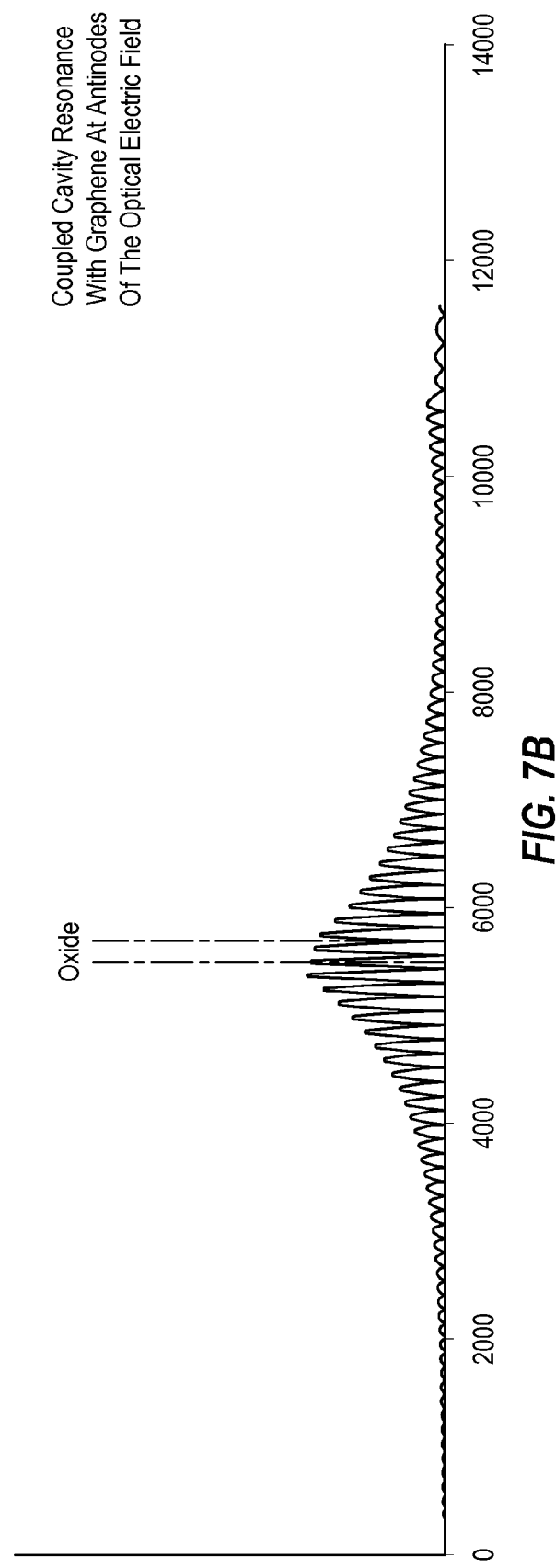
FIG. 7B includes a graph that shows the coupled cavity resonance with graphene regions at antinodes of the optical electric field.

FIG. 7B shows the coupled cavity resonance with graphene regions at antinodes of the optical electric field.

The simulations show that when the mirror reflectivity at the laser Fabrey Perot resonance (FP) is constant, the quantum well gain is constant. When the graphene intra-cavity absorber is operated to be light absorbing, the index of refraction is 2.8, the extinction coefficient is 1.4, the top mirror reflectivity is 0.9955, the quantum well gain at FP is 674/cm, the top mirror transmittance is $7.7 \times 10^{-4}$, and the slope efficiency is 0.209 mw/ma. When the graphene intra-cavity absorber is operated to be light non-absorbing, the index of refraction is 2.27, the extinction coefficient is 0, the top mirror reflectivity is 0.9955, the gain at FP is 672/cm, the top mirror transmittance is $1.1 \times 10^{-3}$, and the slope efficiency is 0.297 mw/ma. It is noted that VCSEL has constant top mirror reflectivity, and suitably constant quantum well gain, but there is a large change in top mirror transmission and VCSEL slope efficiency. This shows the graphene intra-cavity absorber can be operated to modulate the light from the VCSEL without disturbing the lasing region, which can be used to modulate the light transmission with data and is not limited by delays in coupling the gain and photon density. Accordingly, it is reasonable to modulate the slope efficiency without changing the required gain, which may be performed using the index or refraction change of the graphene intra-cavity absorber to make up for the extinction coefficient change. This is advantageous because of the temperature independence of the graphene.

When using an AlGaAs mirror as a lower modulator mirror, the index of refraction of graphene is 2.8, the extinction coefficient is 1.4, the quantum well gain at FP is 514/cm, and the slope efficiency is 0.43 mw/ma. When using an AlGaAs mirror as a lower modulation mirror to be light non-absorbing, the index of refraction is 2.27, the extinction coefficient is 0, the gain at FP is 510/cm, and the slope efficiency is 0.49. Again with an AlGaAs lower modulator mirror the gain can be kept constant with modulation of the slope efficiency.

In view of the foregoing, the graphene intra-cavity absorber within or coupled with the VCSEL cavity can provide significant advantages. One advantage includes the graphene intra-cavity absorber being temperature independent and wavelength independent, which allows for implementation into a wide array of VCSELs. Substantially any type of VCSEL operating at any wavelength and any temperature may be created with the graphene intra-cavity absorber for data modulation. Additionally, the benefits result in single AC-drive VCSELs being stable and operational.

The graphene intra-cavity absorber can be used as an intra-cavity absorber in any VCSEL structure. The graphene intra-cavity absorber can include one graphene region and a contact region sandwiching a dielectric region, or include two graphene regions sandwiching a dielectric region. The graphene intra-cavity absorber can be used at various locations in the VCSEL, and generally between the active region and the light emission surface. The graphene intra-cavity absorber can be included within an upper DBR mirror stack, between an upper DBR mirror stack and dielectric mirror stack, or within a dielectric mirror stack. The graphene intra-cavity absorber can be configured and located such that the VCSEL has high-speed operation, a high extinction ratio, and temperature insensitive modulation. The extremely high optical absorption of graphene (e.g., complex index: n=2.27 k=1.6) and the capability of the high optical absorption to be modulated as a function of electric field with temperature insensitivity irrespective of electric field direction can facilitate effective implementation in VCSELs as optical intra-cavity absorbers.

FIG. 4 indicates one embodiment of the VCSEL having the graphene intra-cavity absorber. An abbreviated VCSEL structure of the region over the active region is shown to include eight layers of P-type semiconductor DBRs, two graphene regions with 5 nm of high dielectric material therebetween (e.g., tantalum oxide or aluminum oxide), and nine layers of SiO2/Si3N4 mirror pairs. However, the VCSEL having the graphene intra-cavity absorber can be configured as described herein or varied within reason under the art of VCSELs.

FIG. 5 shows simulated optical mode E-field magnitude superimposed on the design of FIG. 4. The graphene regions can placed at the E-field magnitude maximum, which indicate the ability to change the laser slope efficiency from 0.8 to 0.25 by modulating absorption in the graphene, which can be controlled by the voltage between the VCSEL anode and the graphene regions using only 2 to 5 V of voltage swing. Keeping the graphene regions of the graphene intra-cavity absorber close to the VCSEL semiconductor structure can also allow the graphene regions to be about or less than 20 um in diameter, which keeps the capacitance low enough for high-speed operation. This is a significant advance over other graphene intra-cavity absorbers.

The VCSELs having the graphene intra-cavity absorber can include one extra electrode terminal compared to standard VCSELs when the single graphene region embodiment is used that also includes the contact region to sandwich the dielectric. The VCSELs having the graphene intra-cavity absorber can include two extra electrode terminals compared to standard VCSELs when the graphene intra-cavity absorber includes two graphene regions sandwiching a dielectric region. The VCSELs can also have thick dielectric regions for the dielectric mirrors.

The VCSELS can include integration of the graphene intra-cavity absorber structure into a semiconductor region. This can allow implementation of 40 Gbps+VCSELs over the entire communications wavelength range of about 795 nm to about 1550 nm without the problem of limited differential gain inherent in many active region material systems used in current direct modulated VCSEL technology or without the temperature tuning and growth tolerance limitations of other intra-cavity absorber-based approaches.

Accordingly, any reasonable VCSEL design can be modified to include the graphene intra-cavity absorber of the present technology. The VCSEL can be any usable wavelength, which can be continuously from about 795 or 850 nm to about 1.5 microns, where 908 nm to 1.3 microns can be specific embodiments. VCSELs can be configured to provide such wavelengths as is known in the art, and which may be further developed. Any such VCSEL can be modified to include the graphene intra-cavity absorber described herein in order to be used for data modulation. The VCSEL structure can be any VCSEL structure having the graphene intra-cavity absorber. An advantage of the technology is the ability to include the graphene intra-cavity absorber in any VCSEL, in part because the graphene intra-cavity absorber is wavelength agnostic and temperature agnostic. As such, the graphene intra-cavity absorber can operate at any wavelength and any temperature within reason for a VCSEL. The VCSEL structural compositions can be modified with any type of mirror region, dielectric mirror region, semiconductor mirror region, active region, quantum well, quantum well barrier, confining region, conducting region, blocking region, or the like so that the VCSEL is operational and includes the graphene intra-cavity absorber of the technology.

The semiconductor structure of the VCSEL can be any type. Also, the number of dielectric mirrors, number of semiconductor mirrors, number of quantum wells, number of quantum well barriers, number of confining regions, and number of conducting regions can be modified as desirable for an operational VCSEL at any wavelength or operating condition. In one option, few to no semiconductor mirrors can be used in the VCSEL having the graphene intra-cavity absorber. The VCSEL can be any type, including, but not limited to, oxide VCSELs, POST VCSELs, or any other. Thus, the graphene intra-cavity absorber in the intra-cavity structure of the VCSEL can be used to modulate VCSEL data. The intra-cavity graphene intra-cavity absorber in a VCSEL thereby can be employed in any VCSEL at any wavelength.

In view of the disclosure provided herein, the graphene intra-cavity absorber can be operational to allow for VCSELs having very high bandwidths, such as: 28 Gbps, 40 Gbps, 56 Gbps, 100 Gbps, or higher as technology advances.

The VCSELS can be designed in accordance with many different embodiments. Some embodiments can include an insulator region under the bottom graphene region in the two-graphene region graphene intra-cavity absorber sandwich, which insulator region is between the graphene intra-cavity absorber sandwich and the VCSEL contact region or conduction region. In one aspect, multiple insulating regions can be used in the same region with conducting regions between, which may also be used with the single graphene region embodiment.

Generally, the methods of manufacture can be similar to any method of manufacturing a VCSEL. The semiconductor portion can be made by any process, such as epitaxial deposition, such as molecular beam epitaxy (MBE). The graphene region can be deposited by any process for depositing graphene. The dielectric region in the graphene intra-cavity absorber can be deposed by any process for deposing a dielectric region. The top dielectric mirror may also be fabricated by standard techniques.

The VCSEL can be manufactured by various processes. For example, the processes can include PECVD (Plasma Enhanced Chemical Vapor Deposition), E-beam Evaporation, Atomic Layer Deposition, sputtering, or the like can be used. These processes can be used to deposit a VCSEL dielectric mirror once the first layer that contacts the graphene layer is put down. The process can depend on various manufacturing issues. In one option, a SiNx (Silicon Nitride) layer or region can be deposited on top of and in contact with the graphene regions.

Methods of manufacture can include separately depositing insulating materials and transparent conductor regions. However, it can be possible to make some of the insulator and conducting regions in the VCSEL semiconductor epitaxy structure, followed by a wet oxidation. Accordingly, one or more AlAs or $Al_{0.99}Ga_{0.01}As$ or other similar region may be grown into the epitaxial structure, and can be oxidized to become insulating aluminum oxide, and then overlying GaAs regions become the transparent conductors. Also, at 850 nm, the GaAs regions can be semitransparent, and at wavelengths longer than about 890 nm they can be totally transparent. The advantages can include good thickness control and substantial reduction of subsequent processing steps.

Figure 8A:
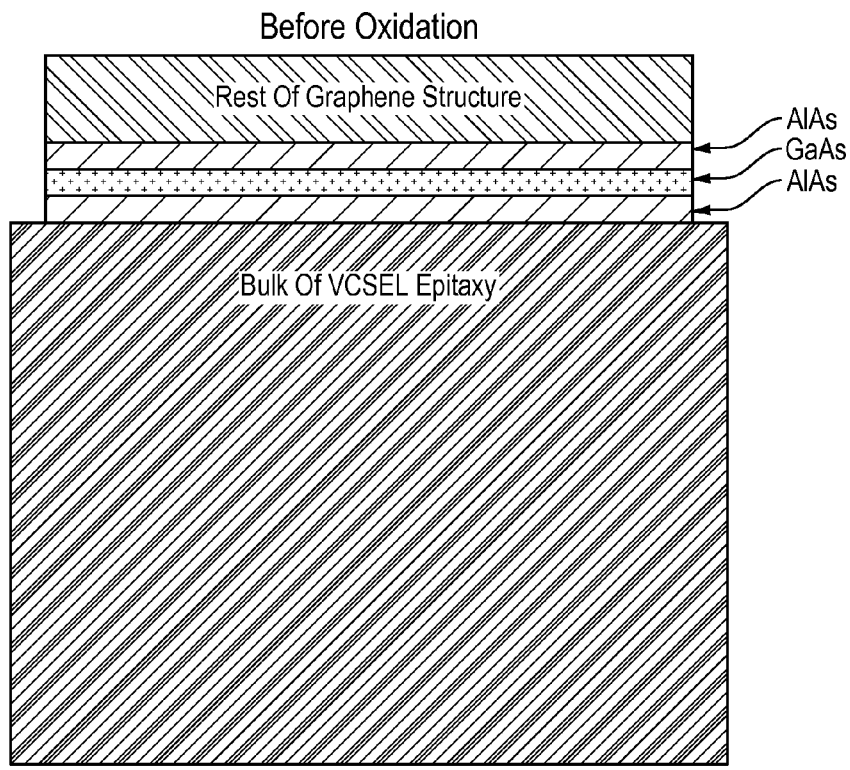
FIG. 8A illustrates a cross-sectional profile of an embodiment of a VCSEL having a graphene intra-cavity absorber before oxidation.
Figure 8B:
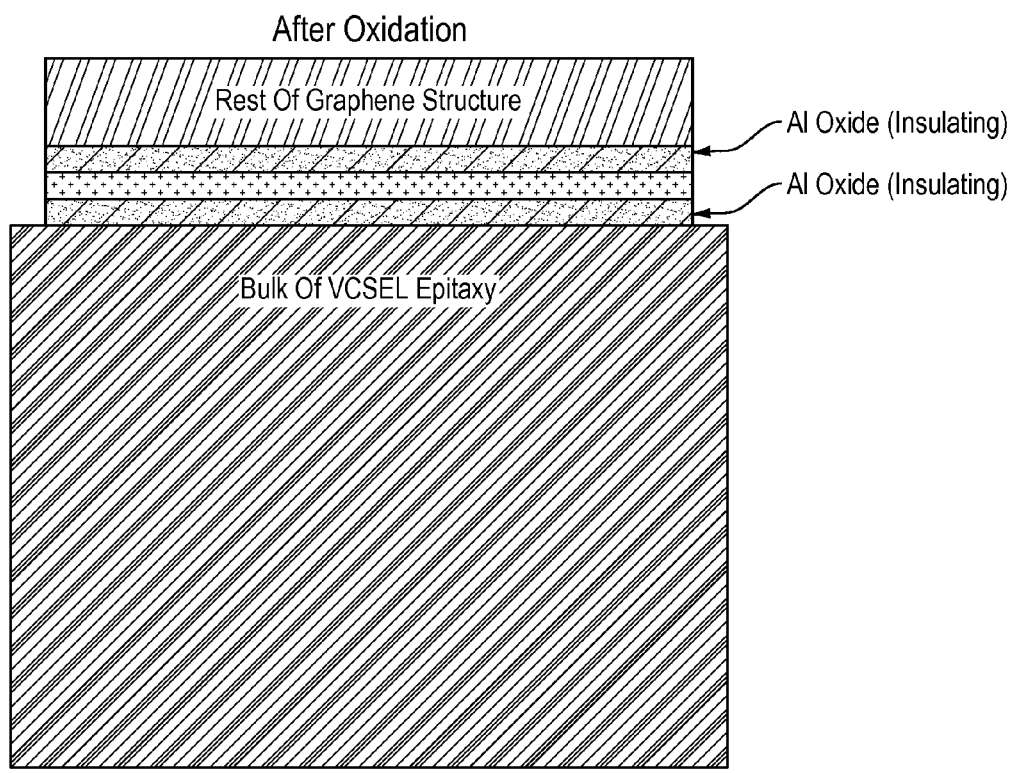
FIG. 8B illustrates a cross-sectional profile of an embodiment of a VCSEL having a graphene intra-cavity absorber after oxidation.

FIGS. 8A-8B illustrate the VCSEL before and after the oxidation step, which provides for insulating aluminum oxide between the graphene intra-cavity absorber (e.g., identified as Rest of graphene structure) and the bulk of the VCSEL semiconductor epitaxy. FIG. 8A illustrates a cross-sectional profile of an embodiment of a VCSEL having a graphene intra-cavity absorber before oxidation. FIG. 8B illustrates a cross-sectional profile of an embodiment of a VCSEL having a graphene intra-cavity absorber after oxidation. While there are two AlAs regions that are oxidized to aluminum oxide, only one may be used or more than two may be used. The number of insulating and GaAs regions between the graphene intra-cavity absorber and VCSEL semiconductor epitaxy may be varied as desired or optimized. The methods used to grow semiconductor epitaxy material are expected to be the same as those used to grow conventional VCSELs.

In one aspect, the graphene intra-cavity absorber can be modified so that the graphene regions are replaced by other materials that have similar properties. As such, a material with similar optical and electrical properties of graphene may be substituted for one or both of the graphene regions of the graphene intra-cavity absorber. Also, such similar materials may be used for one or more discrete regions of the top graphene region and/or bottom graphene region of the graphene intra-cavity absorber. Accordingly, one or both of the graphene regions of the graphene intra-cavity absorber may be devoid of graphene; however, references to the graphene intra-cavity absorber or graphene regions or regions may also refer to and describe an embodiment where a similar material to graphene supplements or replaces the graphene in the graphene intra-cavity absorber. For example, a graphene-similar intra-cavity absorber can include materials that are similar to graphene to supplement and/or replace the graphene regions of the graphene intra-cavity absorber described herein.

In one embodiment, the graphene regions in any graphene intra-cavity absorber described herein can be supplemented with or replaced by a region of molybdenum disulfide with gold nanoparticles.

In one embodiment, the graphene regions in any graphene intra-cavity absorber described herein can be supplemented with or replaced by a region of an organic material configured to be a two-dimensional conductor, which may be fabricated to have Dirac points as graphene does. In one example, the graphene regions in any graphene intra-cavity absorber described herein can be supplemented with or replaced by a region of alpha-(BEDT-TTF)2-3.

Additionally, the VCSEL can include one or more or multiple graphene intra-cavity absorbers, which can be included anywhere in the VCSEL that allows operation. The one or more or multiple graphene intra-cavity absorbers can be above the active region, below the active region, within the top semiconductor mirror, within the top mirror, within the bottom semiconductor mirror, within the bottom mirror, between the active region and a mirror, between the active region and a semiconductor mirror, under a contact region, over a contact region, separated from a contact region by an insulating region, between a contact region and a dielectric mirror stack, within a dielectric mirror stack, and/or over a dielectric mirror stack, or anywhere else in a VCSEL structure.

Additionally, a region or layer of material may be applied adjacent to the graphene so that the deposition or transfer of the graphene may be enhanced. This region or layer may be thin. An example is 2-3 monolayers of nickel or copper. Additionally, a region or layer of material may be configured adjacent the graphene so that the properties of the graphene are not degraded excessively. An example can include a diamond or diamond like material. This layer can be part of the graphene layer and between the graphene material and the adjacent material, such as the dielectric.

Figure 9:
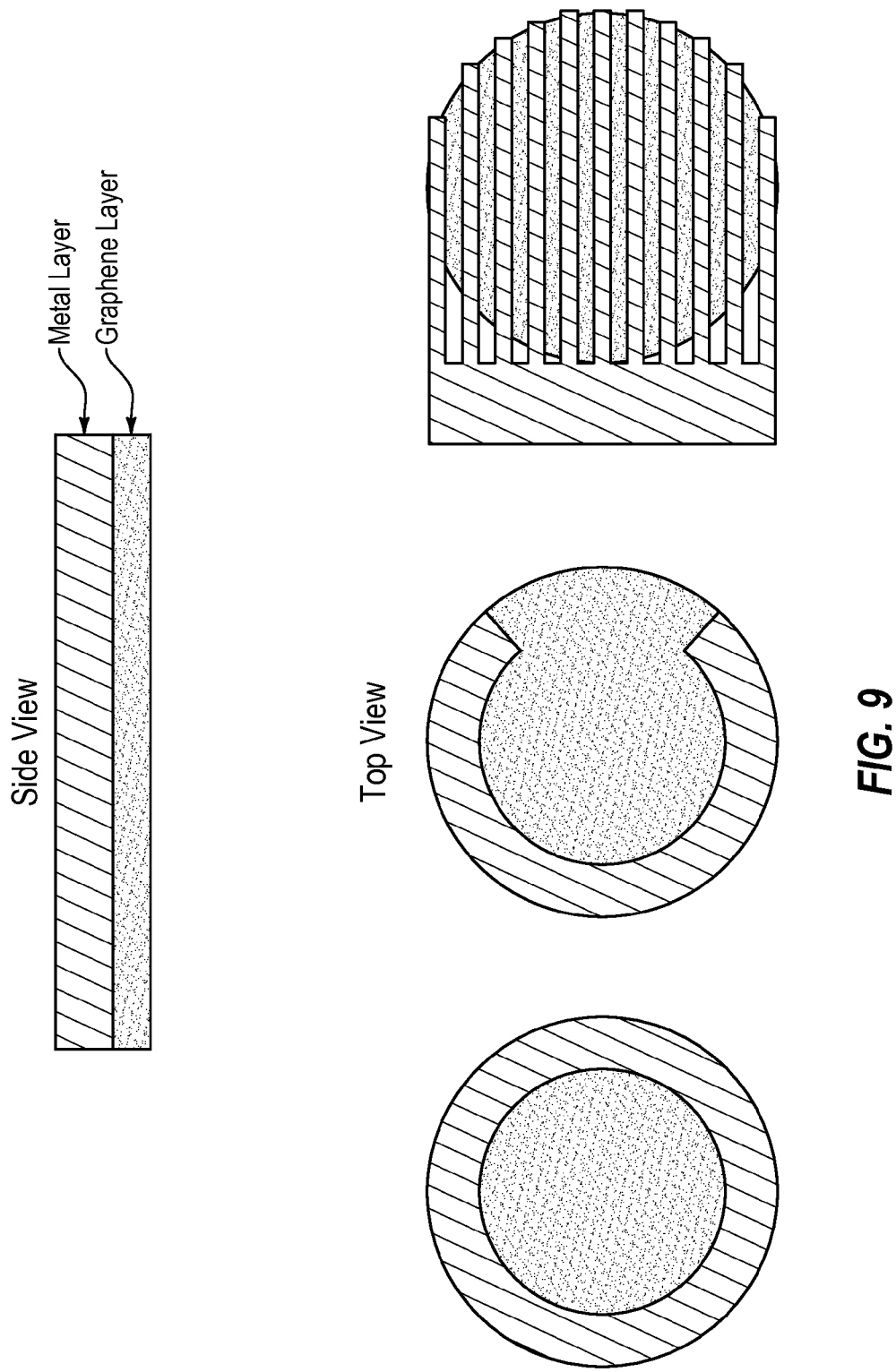
FIG. 9 illustrates some example embodiments of non-transparent electrodes in relation to the graphene regions.

In some embodiments, the graphene electrodes can be a transparent conductor, where any transparent conductor material can be used. However, in some instances the graphene electrodes can be non-transparent, such as metal. It is noted that the graphene electrodes are electrodes coupled to the graphene, and are not comprised of graphene material. As such, FIG. 9 illustrates some example embodiments of non-transparent electrodes in relation to the graphene regions. Also, the metal can be replaced with non-metal, non-transparent electrodes. Also, the transparent electrodes can have similar configurations or planar configurations that cover the graphene region.

In one embodiment, a VCSEL can include a graphene intra-cavity absorber having at least one graphene region and at least one dielectric region adjacent to the graphene region. The VCSEL can also include a graphene electrode electronically coupled with at least one graphene region. The VCSEL can also include a contact region adjacent with at least one dielectric region. The VCSEL can also include a contact electrode electronically coupled with the contact region. The VCSEL can also include a base electrode electronically coupled with a base of a semiconductor region of the VCSEL.

In one embodiment, a graphene intra-cavity absorber is between the contact region and a dielectric mirror. In one aspect, at least one graphene intra-cavity absorber is in contact with the contact region, such that the contact electrode electronically coupled to the contact region provides an E-field to the graphene intra-cavity absorber. In one aspect, the graphene electrode can be electronically coupled with the at least one graphene region provides modulation voltage to the graphene intra-cavity absorber.

In one embodiment, the VCSEL can include at least two graphene regions sandwiching the at least one dielectric region. In one aspect, a first graphene electrode electronically is coupled with a first graphene region and a second graphene electrode electronically coupled with a second graphene region.

In one aspect, the graphene intra-cavity absorber is between an active region and a substrate. In one aspect, the graphene intra-cavity absorber is within a bottom mirror. In one aspect, the graphene intra-cavity absorber is within a bottom semiconductor mirror. In one aspect, the graphene intra-cavity absorber is between an active region and a bottom semiconductor mirror. In one aspect, the graphene intra-cavity absorber is above an active region. In one aspect, the graphene intra-cavity absorber is in a top mirror. In one aspect, the graphene intra-cavity absorber is in a top semiconductor mirror. In one aspect, the graphene intra-cavity absorber is between a top mirror and a contact region that is electronically coupled with a contact electrode. In one aspect, the graphene intra-cavity absorber is over a contact region. In one aspect, the graphene intra-cavity absorber includes a contact region. In one aspect, the graphene intra-cavity absorber is over a contact region with an insulating region therebetween. In one aspect, the graphene intra-cavity absorber is between a dielectric mirror and a contact region. In one aspect, the graphene intra-cavity absorber is in a dielectric mirror. In one aspect, the graphene intra-cavity absorber is longitudinally aligned with an aperture of an oxide aperture. In one aspect, the graphene intra-cavity absorber is within a mesa. In one aspect, the graphene intra-cavity absorber is within a mesa with a dielectric mirror stack. In one aspect, the graphene intra-cavity absorber has lateral sides forming sides of a mesa. In one aspect, the graphene intra-cavity absorber includes lateral sides having a passivation region.

In one embodiment, the VCSEL includes a passivation region and/or environmental protection region over the graphene intra-cavity absorber. In one aspect, the VCSEL includes a bottom electrode region under a bottom mirror stack. In one aspect, the VCSEL includes a top mirror stack. In one aspect, the VCSEL includes an active region. In one aspect, the VCSEL includes a contact region over a top mirror stack. In one aspect, the VCSEL includes a dielectric mirror stack over the top mirror stack.

In one embodiment, a VCSEL can include: a bottom electrode; a bottom mirror stack electrically coupled to and over the bottom electrode; an active region over the bottom mirror stack; a top mirror stack over the active region; an oxide aperture over the active region; a contact region over the top mirror stack; a contact electrode electrically coupled with the contact region; a dielectric region over the contact region; a graphene region over the dielectric region; a graphene electrode electronically coupled with the graphene region; and a dielectric mirror over the graphene region.

In one embodiment, a VCSEL can include: a bottom electrode; a bottom semiconductor mirror stack electrically coupled to and over the bottom electrode; an active region over the bottom semiconductor mirror stack; a top semiconductor mirror stack over the active region; an oxide aperture over the active region; a contact region over the top semiconductor mirror stack; an annular contact electrode electrically coupled with the contact region; a dielectric region over the contact region and within an aperture of the annular contact electrode; a graphene region over the dielectric region; a graphene electrode electronically coupled with the graphene region; and a dielectric mirror over the graphene region.

In one embodiment, a VCSEL can include: a bottom electrode; a bottom mirror stack electrically coupled to and over the bottom electrode; an active region over the bottom mirror stack; a top mirror stack over the active region; an oxide aperture over the active region; a contact region over the top mirror stack; a contact electrode electrically coupled with the contact region; a bottom graphene region over the contact region; a dielectric region over the contact region; a graphene region over the dielectric region; a graphene electrode electronically coupled with the graphene region; and a dielectric mirror over the graphene region.

In one embodiment, a VCSEL can include: a bottom electrode; a bottom semiconductor mirror stack electrically coupled to and over the bottom electrode; an active region over the bottom semiconductor mirror stack; a top semiconductor mirror stack over the active region; an oxide aperture over the active region; a contact region over the top semiconductor mirror stack; an annular contact electrode electrically coupled with the contact region; an electrically insulating region over the contact region; a bottom graphene region over the contact region with the electrically insulating region therebetween; a bottom graphene electrode electronically coupled with the graphene region; a dielectric region over the contact region and within an aperture of the annular contact electrode; a top graphene region over the dielectric region; a top graphene electrode electronically coupled with the graphene region; and a dielectric mirror over the graphene region.

In one embodiment, a VCSEL can include: a bottom electrode; a bottom mirror stack electrically coupled to and over the bottom electrode; an active region over the bottom mirror stack; a top mirror stack over the active region; an oxide aperture over the active region; a contact region over the top mirror stack; a contact electrode electrically coupled with the contact region; an electrically insulating region over the contact region; a bottom graphene region over the contact region with the electrically insulating region therebetween; a bottom graphene electrode electronically coupled with the graphene region; a dielectric region over the contact region and within an aperture of the annular contact electrode; a top graphene region over the dielectric region; a top graphene electrode electronically coupled with the graphene region; and a dielectric mirror over the graphene region.

In one embodiment, a VCSEL can include: a bottom electrode; a bottom semiconductor mirror stack electrically coupled to and over the bottom electrode; an active region over the bottom semiconductor mirror stack; a top semiconductor mirror stack over the active region; an oxide aperture over the active region; a contact region over the top semiconductor mirror stack; an annular contact electrode electrically coupled with the contact region; an electrically insulating region over the contact region; a bottom graphene region over the contact region with the electrically insulating region therebetween; a bottom graphene electrode electronically coupled with the graphene region; a dielectric region over the contact region and within an aperture of the annular contact electrode; a top graphene region over the dielectric region; a top graphene electrode electronically coupled with the graphene region; and a dielectric mirror over the graphene region. In one embodiment, a VCSEL can include: a bottom electrode; a bottom mirror stack electrically coupled to and over the bottom electrode; an active region over the bottom mirror stack; a top mirror stack over the active region; an oxide aperture over the active region; a contact region over the top mirror stack; a contact electrode electrically coupled with the contact region; an electrically insulating region over the contact region; a bottom graphene region over the contact region with the electrically insulating region therebetween; a bottom graphene electrode electronically coupled with the graphene region; a dielectric region over the contact region and within an aperture of the annular contact electrode; a top graphene region over the dielectric region; a top graphene electrode electronically coupled with the graphene region; and a dielectric mirror containing the graphene intra-cavity absorber, the electrically insulating region being part of the dielectric mirror.

In one embodiment, a VCSEL can include: a bottom electrode; a bottom semiconductor mirror stack electrically coupled to and over the bottom electrode; an active region over the bottom semiconductor mirror stack; a top semiconductor mirror stack over the active region; an oxide aperture over the active region; a contact region over the top semiconductor mirror stack; an annular contact electrode electrically coupled with the contact region; an electrically insulating region over the contact region; a bottom graphene region over the contact region with the electrically insulating region therebetween; a bottom graphene electrode electronically coupled with the graphene region; a dielectric region over the contact region and within an aperture of the annular contact electrode; a top graphene region over the dielectric region; a top graphene electrode electronically coupled with the graphene region; and a dielectric mirror containing the graphene intra-cavity absorber, the electrically insulating region being part of the dielectric mirror.

In one embodiment, a method of manufacturing the VCSEL can include: forming a VCSEL semiconductor region having a contact region; forming a dielectric region over the contact region; forming a graphene region over the dielectric region; and forming a graphene electrode so as to be electrically coupled with the graphene region. In one aspect, the method can include forming a dielectric mirror stack over the graphene region. In one aspect, the method can include forming a bottom graphene region under the dielectric region; and forming a bottom graphene electrode to be electronically coupled with the bottom graphene region. In one aspect, the method can include forming at least one AlAs region and at least one GaAs region between the graphene region and the VCSEL semiconductor region; and oxidizing at least one of the AlAs regions to be an insulating aluminum oxide region.

In one embodiment, a method of emitting modulated light can include: providing the VCSEL of one of the embodiments; operating the VCSEL so as to produce light; and operating the graphene intra-cavity absorber so as to modulate the light.

In one embodiment, a VCSEL can include an integrated intra-cavity absorber and be designed to minimize the back reflection change to the laser cavity with modulation of the output light.

One skilled in the art will appreciate that, for processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety, such as: K. S. Novoselov, A. K. Geim, S. V. Morozov, D. Jiang, Y. Zhang, S. V. Dubonos, I. V. Grigorieva, and A. A. Firsov, "Electric field effect in atomically thin carbon films," Science 306, 666-669 (2004); T. Stauber, N. M. R. Peres, and A. K. Geim, "Optical conductivity of graphene in the visible region of the spectrum," Phys. Rev. B 78 (8), 085432 (2008); M. Liu, X. Yin, E. Ulin-Avila, B. Geng, T. Zentgraf, L. Ju, F. Wang, X. Zhang, "A graphene-based broadband optical modulator," Nature 474 64-67 (2011); C. C. Lee, S. Suzuki, W. Xie, T. R. Schibli, "Broadband graphene electro-optic modulators with sub-wavelength thickness," Optics Express 20 (5) 5264-5259 (2012); and V. A Shchukin, N. N. Ledentstov, J. A. Lott, H. Quast, F. Hopfer, L. Ya. Karachinsky, M. Kuntz, P. Moser, A. Mutig, A. Strittmatter, V. P. Kalosha, and D. Bimberg, "Ultrahigh-speed electrooptically-modulated VCSELs: modeling and experimental results," SPIE 6889 OH-1 (2008).

All references recited herein are incorporated herein by specific reference in their entirety, such as: U.S. Ser. Nos. 61/878,699; 13/801,444; and 13/763,517.

The invention claimed is:

1. A VCSEL comprising:
a bottom electrode;
a bottom mirror stack electrically coupled to and over the bottom electrode;
an active region having a lasing region over the bottom mirror stack;
a top mirror stack over the active region;
an oxide aperture over the active region;
a contact region over the top mirror stack;
a contact electrode electrically coupled with the contact region;
a graphene intra-cavity absorber having at least one graphene region and at least one dielectric region adjacent to the graphene region and between the graphene region and lasing region such that the dielectric region isolates the graphene region from the lasing region, the graphene intra-cavity absorber including a bottom graphene region over the contact region, a dielectric region over the contact region, and a top graphene region over the dielectric region;
a graphene electrode electronically coupled with the top graphene region; and
a dielectric mirror over the graphene region.

2. The VCSEL of claim 1, wherein the graphene electrode provides modulation voltage to modulate absorption of the graphene intra-cavity absorber.

3. The VCSEL of claim 1, comprising the contact region being adjacent with and in contact with at least one dielectric region.

4. The VCSEL of claim 3, wherein the contact electrode provides an E-field to the graphene intra-cavity absorber.

5. The VCSEL of claim 1, comprising:
at least two graphene regions sandwiching at least one dielectric region therebetween, the at least two graphene regions including the bottom graphene region and top graphene region;
a first graphene electrode electronically coupled with a first graphene region; and
a second graphene electrode electronically coupled with a second graphene region.

6. The VCSEL of claim 1, wherein the graphene intra-cavity absorber is in a top mirror.

7. The VCSEL of claim 5, wherein the graphene intra-cavity absorber is over a contact region with an insulating region therebetween.

8. The VCSEL of claim 1, comprising:
the bottom mirror stack is a bottom semiconductor mirror stack electrically coupled to and over the bottom electrode;
the top mirror stack is a top semiconductor mirror stack over the active region;
the contact electrode being an annular contact electrode electrically coupled with the contact region;
an electrically insulating region over the contact region;
the bottom graphene region over the contact region with the electrically insulating region therebetween;
a bottom graphene electrode electronically coupled with the bottom graphene region;
the dielectric region over the contact region is within an aperture of the annular contact electrode.

9. A method of emitting modulated light, the method comprising, providing the VCSEL of claim 1;
operating the VCSEL so as to produce light; and
operating the graphene intra-cavity absorber so as to modulate the light.

10. The method of claim 9, the operating of the graphene intra-cavity absorber including changing light absorption characteristics thereof with electrical current.

11. The method of claim 10, comprising providing sufficient electrical current to allow light to pass through the graphene intra-cavity absorber and be emitted from the VCSEL.

12. The VCSEL of claim 1, the lasing region being configured so that the VCSEL emits a laser having a wavelength of 850 nm to 1.5 microns.

13. The method of claim 9, the lasing region being configured so that the VCSEL emits a laser having a wavelength of 850 nm to 1.5 microns.

14. A method of manufacturing a VCSEL, the method comprising
forming a VCSEL semiconductor region having a lasing region, and a contact region over the lasing region;
forming a dielectric region over the contact region;
forming a graphene region over the dielectric region such that the dielectric region isolates the graphene region from the lasing region;
forming a graphene electrode so as to be electrically coupled with the graphene region;
forming at least one AlAs region and at least one GaAs region between the graphene region and the VCSEL semiconductor region; and
oxidizing at least one of the AlAs regions to be an insulating aluminum oxide region.

15. The method of claim 14, comprising forming a dielectric mirror stack over the graphene region.

16. The method of claim 14, comprising:
forming a bottom graphene region under the dielectric region; and forming a bottom graphene electrode to be electronically coupled with the bottom graphene region.

17. The method of claim 14, comprising:

forming a silicon dioxide region under the bottom graphene region; and forming a conductive oxide region under the silicon dioxide region.

18. The method of claim 17, comprising forming an electrode to be in electrical contact with the silicon dioxide region and lower conductive oxide region.

19. The method of claim 14, comprising configuring the lasing region so that the VCSEL emits a laser having a wavelength of 850 nm to 1.5 microns.

20. A VCSEL comprising:

a bottom electrode;

a bottom semiconductor mirror stack electrically coupled to and over the bottom electrode;

an active region having a lasing region over the bottom semiconductor mirror stack;

a top semiconductor mirror stack over the active region;

an oxide aperture over the active region;

a contact region over the top semiconductor mirror stack;

an annular contact electrode electrically coupled with the contact region;

an electrically insulating region over the contact region;

a graphene intra-cavity absorber having at least one graphene region and at least one dielectric region adjacent to the graphene region and between the graphene region and lasing region such that the dielectric region isolates the graphene region from the lasing region, the graphene intra-cavity absorber including a bottom graphene region over the contact region with the electrically insulating region therebetween, a bottom graphene electrode electronically coupled with the bottom graphene region; a dielectric region over the contact region and within an aperture of the annular contact electrode, and a top graphene region over the dielectric region;

a top graphene electrode electronically coupled with the top graphene region; and a dielectric mirror over the graphene region.

* * * * *